United States Patent [19]
Izumi

[11] Patent Number: 5,932,002
[45] Date of Patent: Aug. 3, 1999

[54] SEED CRYSTALS FOR PULLING A SINGLE CRYSTAL AND METHODS USING THE SAME

[75] Inventor: Teruo Izumi, Hyogo pref., Japan

[73] Assignee: Sumitomo Sitix Corporation, Hyogo, Japan

[21] Appl. No.: 08/919,160

[22] Filed: Aug. 28, 1997

[51] Int. Cl.⁶ .................................................. C30B 15/36
[52] U.S. Cl. .............................. 117/13; 117/35; 117/902; 117/911
[58] Field of Search .............................. 117/13, 35, 902, 117/911, 201; 505/451

[56] References Cited

U.S. PATENT DOCUMENTS

| | | | |
|---|---|---|---|
| 3,135,585 | 6/1964 | Dash | 23/301 |
| 3,271,118 | 9/1966 | Bhola | 23/301 |
| 5,407,907 | 4/1995 | Yamada et al. | 505/451 |

FOREIGN PATENT DOCUMENTS 56104794  8/1991  Japan .............................. C30B 15/00

*Primary Examiner*—Felisa Hiteshew
*Attorney, Agent, or Firm*—Armstrong, Westerman, Hattori, McLeland & Naughton

[57] ABSTRACT

In a conventional method for pulling a single crystal, in order to exclude the dislocation induced in contact of a seed crystal with a melt, a neck having a small diameter has been formed. But when a heavy single crystal having a large diameter of 12 inches or so is pulled, it is impossible to hold the single crystal, leading to the falling. When the diameter of the neck is made larger in order to prevent the falling, the dislocation cannot be excluded, leading to the propagation of the dislocation to the single crystal. In the present invention, using a seed crystal having a cylindrical body and a conical front portion, the induction of the dislocation is inhibited by making the temperature of the front portion almost the same as the temperature of the melt when the front portion of the seed crystal is brought into contact with the melt and a single crystal is pulled without forming a neck after melting part of the front portion into the melt.

20 Claims, 8 Drawing Sheets

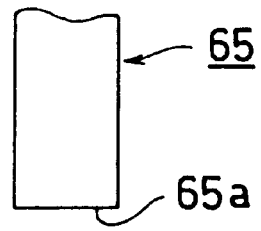
Fig.9(a)
Fig.9(b)
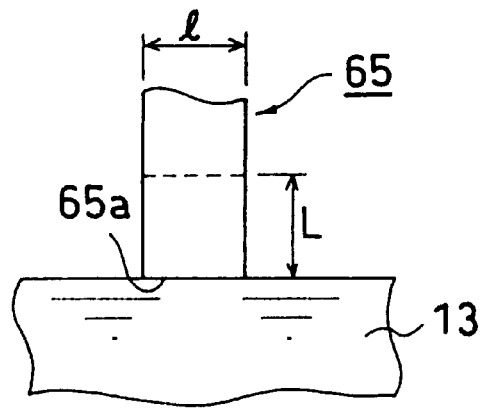
Fig.9(c)
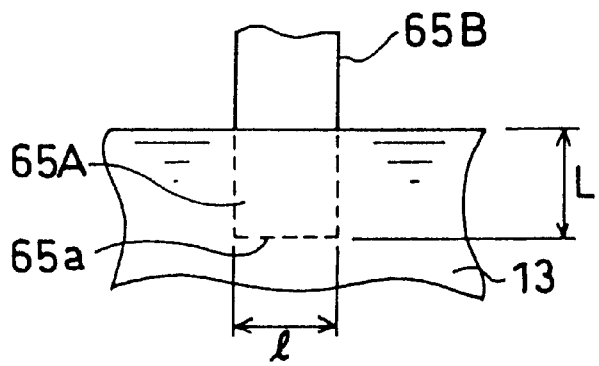
Fig.9(d)
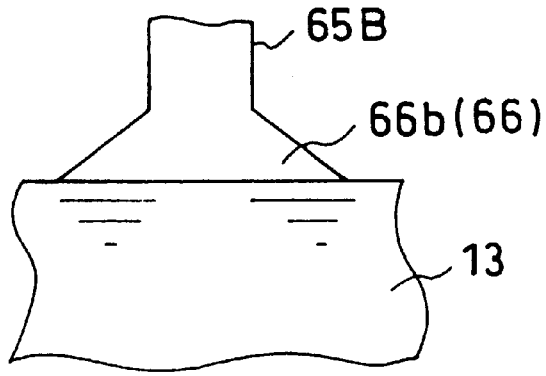

SEED CRYSTALS FOR PULLING A SINGLE CRYSTAL AND METHODS USING THE SAME

BACKGROUND OF THE INVENTION

1. Field of the Invention

The present invention relates to seed crystals for pulling a single crystal and methods using the same and, more particularly, to seed crystals for pulling a single crystal which are used in pulling a single crystal of silicon or the like by a method such as the Czochralski method (hereinafter, referred to as the CZ method) and methods for pulling a single crystal using the same.

2. Description of the Prior Art

At present, as the majority of silicon single crystals used for manufacturing a substrate for forming a circuit component of a LSI (large scale integrated circuit) and the like, silicon single crystals pulled by the CZ method have been used. FIG. 1 is a diagrammatic sectional view of an apparatus for pulling a single crystal used for the CZ method, and in the figure, reference numeral 11 represents a crucible.

The crucible 11 comprises a bottomed cylindrical quartz crucible 11a and a bottomed cylindrical graphite crucible 11b fitted on the outer side of the quartz crucible 11a. The crucible 11 is supported with a support shaft 18 which rotates in the direction shown by the arrow A in the figure at a prescribed speed. A heater 12 of a resistance heating type and a heat insulating mould 17 arranged around the heater 12 are concentrically arranged around the crucible 11. The crucible 11 is charged with a melt 13 of a material for forming a crystal which is melted by the heater 12. On the central axis of the crucible 11, a pulling axis 14 made of a pulling rod or wire is suspended, and at the front thereof, a seed crystal for pulling a single crystal 35 (hereinafter, simply referred to as a seed crystal) is held by a seed chuck 14a. These parts are arranged in a water cooled type chamber 19 wherein pressure can be controlled.

A method for pulling a single crystal 36 using the above-mentioned apparatus for pulling a single crystal is described below by reference to FIGS. 1 and 2. FIGS. 2(a)–(d) are partial magnified front views diagrammatically showing the seed crystal and the vicinity thereof in part of the steps in pulling a single crystal.

Although it is not shown in FIG. 2, the material for forming a crystal is melted by the heater 12. The pressure in the chamber 19 is reduced and is maintained for a period of time so as to sufficiently release gas contained in the melt 13. Then, an inert gas is induced into the chamber 19 so as to make an inert gas atmosphere under reduced pressure within the chamber 19.

While the pulling axis 14 is rotated on the same axis in the reverse direction of the support shaft 18 at a prescribed speed, the seed crystal 35 held at the front of the pulling axis 14 is caused to descend and is brought into contact with the melt 13 so as to make the seed crystal 35 partially melt into the melt 13. Then, the single crystal 36 begins to be pulled (hereinafter, referred to as the seeding step) (FIG. 2(a)).

In making a crystal grow at the front of the seed crystal 35, the pulling axis 14 is pulled at a higher speed than the below-described speed of the formation of the main body 36c. The crystal is narrowed to have a prescribed diameter, leading to the formation of a neck 36a (hereinafter, referred to as the necking step) (FIG. 2(b)).

By slowing down the pulling speed of the single crystal 36 (hereinafter, simply referred to as the pulling speed), the single crystal 36 is made to grow to have a prescribed diameter, leading to the formation of a shoulder 36b (hereinafter, referred to as the shoulder formation step) (FIG. 2(c)).

By pulling the single crystal 36 at a fixed rate, the main body 36c having a uniform diameter and a prescribed length is formed (hereinafter, referred to as the main body formation step) (FIG. 2(d)).

Although it is not shown in FIG. 2, in order to prevent induction of high density dislocation to the single crystal 36 by a steep temperature gradient, the diameter thereof is gradually decreased and the temperature of the whole single crystal 36 is gradually lowered, leading to the formation of an end-cone. Then, the single crystal 36 is separated from the melt 13. Cooling the single crystal 36 is at the end of the pulling of the single crystal 36.

One of the most important steps in the pulling of the single crystal 36 is the above-mentioned necking step (FIG. 2(b)), and the object of the necking step is described below. In the seeding step (FIG. 2(a)), the bottom portion 35a of the seed crystal 35 is preheated to some extent and is dipped into the melt 13. There is a difference of 100° C. or more between the preheating temperature (about 1300° C. and less) and the temperature of the melt 13 (about 1410° C.). Therefore, in dipping the seed crystal 35 into the melt 13, the seed crystal 35 has a steep temperature gradient, leading to the dislocation caused by a thermal stress at the bottom portion 35a of the seed crystal 35. It is necessary to make the single crystal 36 grow after excluding the dislocation which inhibits single crystal growth. Since the dislocation generally tends to grow in the vertical direction to the growth interface of the single crystal 36, the shape of the growth interface (the front plane 36a' of the neck 36a) is made to be downward convex as shown in FIG. 2(b) in the necking step, so as to exclude the dislocation.

In the necking step, the faster the pulling speed is made, the smaller the diameter of the neck 36a can be made, so that the shape of the growth interface can be a downward convex having a smaller diameter. As a result, the dislocation can be inhibited from propagating and can be efficiently excluded.

In the above conventional method for pulling a single crystal, the seed crystal 35 having a diameter of about 12 mm has been generally used in order to pull the single crystal 36 having a diameter of about 6 inches and a weight of 80 kg or so. The larger the diameter of the neck 36a is, the more safely the single crystal 36 can be held, while the smaller the diameter of the neck 36a is, the more efficiently the dislocation can be excluded. In order to meet both of the requirements, the neck 36a having a diameter of 3 mm or so is selected. Recently, however, in order to produce a more highly integrated semiconductor device at a lower cost and more efficiently, the wafer has been required to have a larger diameter. Now, for example, the production of the single crystal 36 having a diameter of 12 inches (300 mm) and a weight of 300 kg or so is desired. In this case, the neck 36a having a conventional diameter (usually 3 mm or so) cannot withstand the weight of the pulled single crystal 36 and breaks, resulting in the falling of the single crystal 36.

In producing the above heavy single crystal 36, the diameter of the neck 36a needs to be about 6 mm in order to prevent the occurrence of troubles such as a fall of the single crystal 36 and to pull the single crystal 36 safely, which is calculated from the silicon strength (about 16 kgf/mm$^2$). However, when the diameter of the neck 36a is 6 mm or more, the dislocation occurs in dipping the seed crystal 35 into the melt 13 and cannot be sufficiently excluded.

SUMMARY OF THE INVENTION

The present invention was developed in order to solve the above problems, and it is an object of the present invention to provide seed crystals for pulling a single crystal, to which dislocation is not induced in contact with the melt during the single crystal growth, leading to the omission of the necking step.

It is another object of the present invention to provide methods for pulling a single crystal using the above seed crystals for pulling a single crystal, wherein dislocation is prevented from propagating without forming a neck so that even a heavy single crystal can be pulled safely and at low cost.

In order to achieve the above objects, a seed crystal for pulling a single crystal (1) according to the present invention, is characterized by having a cylindrical body and a conical front portion.

Using the seed crystal for pulling a single crystal (1), the induction of dislocation caused by a sudden change in temperature (thermal shock) can be prevented, since the front portion of the seed crystal is conical and has a small heat capacity so that the temperature of the front portion and its vicinity is easily raised close to that of the melt in contact with the melt after preheating the seed crystal. Therefore, the single crystal can be pulled without propagating the dislocation, even if no neck is formed. Even when a heavier single crystal than before is pulled, the single crystal can be sufficiently supported. Since the seed crystal can be easily produced by shaping a single crystal into the above form and a neck need not be formed, the size of the whole seed crystal can be made smaller than that used in a usual method, resulting in the reduction of the cost of producing a seed crystal.

A seed crystal for pulling a single crystal (2) according to the present invention, defined in the seed crystal for pulling a single crystal (1), is characterized by having a cylindrical body whose diameter is 6 mm or more.

Using the seed crystal for pulling a single crystal (2), even when a heavy single crystal having a main body whose diameter is about 12 inches and a weight of 300 kg or so is pulled, the body of the seed crystal can sufficiently support the single crystal, since the diameter of the cylindrical body is 6 mm or more, which is sufficiently large.

A method for pulling a single crystal (1) according to the present invention is characterized by using the seed crystal for pulling a single crystal (1) or (2), pulling a single crystal without forming a neck after dipping and melting the front portion of the seed crystal for pulling a single crystal into a melt.

In the method for pulling a single crystal (1), using the inexpensive seed crystal for pulling a single crystal (1) or (2), the seed crystal can be melted until the portion having a diameter of a sufficient strength for the pulling without inducing dislocation to the seed crystal is formed in contact with the melt. Therefore, the single crystal can be pulled without forming a neck, and even a heavy single crystal can be pulled safely and at low cost.

A method for pulling a single crystal (2) according to the present invention, which is carried out according to the method for pulling a single crystal (1), is characterized by the seed crystal for pulling a single crystal whose front portion has a diameter of 6 mm or more after being melted.

In the method for pulling a single crystal (2), even a heavy single crystal having a main body whose diameter is about 12 inches and a weight of 300 kg or so can be pulled safely and at low cost.

A seed crystal for pulling a single crystal (3) according to the present invention is characterized by using phosphorus (P) as a dopant ranging in dopant concentration from $1\times10^{19}$ to $1\times10^{21}/cm^3$.

Using the seed crystal for pulling a single crystal (3), the dopant concentration of P ranges from $1\times10^{19}$ to $1\times10^{21}/cm^3$, which is higher than the general dopant concentration of P ($1\times10^{15}/cm^3$), so that the stress level necessary for the dislocation induced in contact with the melt to propagate upward in the seed crystal can be made higher than usual. That is, since the dislocation does not propagate, as long as a higher stress than usual does not work, the portion where the dislocation is induced can be excluded without propagating the dislocation by melting the portion where the dislocation is induced into the melt at a moderate speed during contact with the melt and the single crystal can be pulled using the dislocation-free seed crystal as a base. Therefore, the Dislocation Free rate of the pulled single crystals can be made higher.

A seed crystal for pulling a single crystal (4) according to the present invention is characterized by using boron (B) as a dopant ranging in dopant concentration from $5\times10^{19}$ to $6\times10^{20}/cm^3$.

Using the seed crystal for pulling a single crystal (4), the dopant concentration of B ranges from $5\times10^{19}$ to $6\times10^{20}/cm^3$, which is higher than the general dopant concentration of B ($1\times10^{15}/cm^3$), so that the stress level necessary for the dislocation caused in contact with the melt to propagate upward in the seed crystal can be made higher than usual. Therefore, the same effects as those in the case of the seed crystal for pulling a single crystal (3) can be obtained.

A method for pulling a single crystal (3) according to the present invention is characterized by using the seed crystal (3) or (4), pulling a single crystal without forming a neck after dipping and melting the front portion of the seed crystal into a melt.

In the method for pulling a single crystal (3), since the front portion of the seed crystal to which dislocation is induced in contact with the melt is melted, the single crystal can be pulled using the dislocation-free seed crystal as a base. Accordingly, since the dislocation hardly propagates to the pulled single crystal, the dislocation-free single crystal can be efficiently pulled even if the necking step is omitted. Since the necking step can be omitted, it becomes unnecessary to hold a single crystal by a small neck, so that the diameter of the seed crystal is the smallest diameter for holding the single crystal. As long as the seed crystal has a sufficient strength, even a heavy single crystal can be pulled safely without caring about troubles such as falling. In addition, since a neck need not be formed, the seed crystal whose diameter is conventionally 12 mm or so, can be narrowed to 6 mm or so, leading to the reduction of the material cost required for the seed crystal and to the simplification of the pulling process.

Since the seed crystal (3) or (4), to which no dislocation is induced, is used, the dislocation is not easily induced to the pulled single crystal so that the Dislocation Free rate of the single crystals can be improved. As a result, the yield of the pulled single crystals can be improved.

A method for pulling a single crystal (4) according to the present invention, which is carried out according to the method for pulling a single crystal (3), is characterized by the length of the seed crystal melted into the melt, which is the same as the diameter thereof or longer.

In the method for pulling a single crystal (4), since the length of the seed crystal melted into the melt is the same as the diameter thereof or longer, even if there is a dislocation portion where dislocation is induced by a thermal shock (where the dislocation exists), it can be almost melted and the residual of the seed crystal is allowed to include only a dislocation-free portion. As a result, the yield of the pulled single crystals can be more improved.

A seed crystal for pulling a single crystal (5) according to the present invention is characterized by having a concave whose maximum depth is larger than the radius of the seed crystal, which is formed on the side portion of the seed crystal.

Using the seed crystal for pulling a single crystal (5), the dislocation induced in contact with the melt propagates toward the open surface of the concave (hereinafter, referred to as the free surface) from the property of the propagation direction. Since the maximum depth of the concave is larger than the radius of the seed crystal, most of the propagating dislocation passes through the free surface. Therefore, by melting the front portion of the seed crystal including the portion where dislocation is induced in contact with the melt and the portion where the dislocation propagates (hereinafter, collectively referred to as the dislocation portions) into the melt till above the concave at a moderate speed, the dislocation portions can be excluded, so that the single crystal can be pulled using the dislocation-free seed crystal as a base. As a result, the Dislocation Free rate of the pulled single crystals can be made higher.

A seed crystal for pulling a single crystal (6) according to the present invention, defined in the seed crystal for pulling a single crystal (5), is characterized by two or more concaves formed in symmetrical positions to the central axis of the seed crystal.

Using the seed crystal for pulling a single crystal (6), even if some of the dislocation remains without passing through the free surface of one concave, the remaining dislocation passes through the free surface of another concave which is formed in the symmetrical position to the central axis of the seed crystal, that is, above the concave in the direction of the propagation of the remaining dislocation. Therefore, when the front portion of the seed crystal including the dislocation portions is melted into the melt to above the concaves at a moderate speed, the dislocation portions can be certainly excluded so that the single crystal can be pulled using the dislocation-free seed crystal as a base. As a result, the Dislocation Free rate of the pulled single crystals can be certainly made higher.

A method for pulling a single crystal (5) according to the present invention is characterized by using the seed crystal (5) or (6), pulling a single crystal without forming a neck after dipping and melting the front portion of the seed crystal into the melt to above the concaves.

In the method for pulling a single crystal (5), since the front portion of the seed crystal including the dislocation portions is melted till above the concaves so as to make the dislocation pass through the free surfaces of the concaves, the single crystal can be pulled using the dislocation-free seed crystal as a base. Accordingly, since the dislocation hardly propagates to the pulled single crystal, a dislocation-free single crystal can be efficiently pulled even if the necking step is omitted. Since the necking step can be omitted, it becomes unnecessary to hold a single crystal by a small neck, so that the diameter of the seed crystal is the smallest diameter for holding the single crystal. As long as the seed crystal has a sufficient strength, even a heavy single crystal can be pulled safely without caring about troubles such as falling. In addition, since a neck need not be formed, the seed crystal whose diameter is conventionally 12 mm or so, can be narrowed to 6 mm or so, leading to the reduction of the material cost required for the seed crystal and to the simplification of the pulling process.

A seed crystal for pulling a single crystal (7) according to the present invention is characterized by having an oxygen content ranging in $13-18 \times 10^{17}/cm^3$.

Using the seed crystal for pulling a single crystal (7), the oxygen content ranges in $13-18 \times 10^{17}/cm^3$, which is higher than the general oxygen content ($11 \times 10^{17}/cm^3$), so that the stress level necessary for the dislocation induced in contact with the melt to propagate upward in the seed crystal can be made higher than usual. That is, since the dislocation does not propagate, as long as a higher stress than usual does not work, the portion where the dislocation is induced can be excluded without propagating the dislocation by melting the portion where the dislocation is induced in contact with the melt at a moderate speed and the single crystal can be pulled using the dislocation-free seed crystal as a base. Therefore, the Dislocation Free rate of the pulled single crystals can be made higher.

A seed crystal for pulling a single crystal (8) according to the present invention, defined in the seed crystal for pulling a single crystal (3), (4), (5), (6), or (7), is characterized by having a diameter of 6 mm or more.

Using the seed crystal for pulling a single crystal (8), the same effects as those in the cases of the seed crystals for pulling a single crystal (3)–(7) can be obtained. And since the diameter of the seed crystal is 6 mm or more, the seed crystal has a sufficient strength for pulling even a heavy single crystal having a weight of 300 kg or more, for example, which is calculated from the silicon strength (about 16 $kgf/mm^2$), so that a single crystal can be pulled safely without caring about troubles such as the falling of the single crystal caused by breakage of the seed crystal.

A method for pulling a single crystal (6) according to the present invention is characterized by using the seed crystal (7), pulling a single crystal without forming a neck after dipping and melting the front portion of the seed crystal into a melt.

In the method for pulling a single crystal (6), when the front portion of the seed crystal where the dislocation is induced in contact with the melt is melted, oxygen can inhibit the dislocation from propagating upward, so that the single crystal can be pulled using the dislocation-free seed crystal as a base. Accordingly, since the dislocation hardly propagates to the pulled single crystal, a dislocation-free single crystal can be efficiently pulled even if the necking step is omitted. And since the necking step can be omitted, it becomes unnecessary to hold a single crystal by a small neck, so that the diameter of the seed crystal is the smallest diameter for holding the single crystal. As long as the seed crystal has a sufficient strength, even a heavy single crystal can be pulled safely without caring about troubles such as falling. In addition, since a neck need not be formed, the seed crystal whose diameter is conventionally 12 mm or so, can be narrowed to 6 mm or so, leading to the reduction of the material cost required for the seed crystal and to the simplification of the pulling process.

A method for pulling a single crystal (7) according to the present invention is characterized by using the seed crystal (8), pulling a single crystal without forming a neck after dipping and melting the front portion of the seed crystal into a melt.

In the method for pulling a single crystal (7), the same effects as those in the method for pulling a single crystal (6) can be obtained.

A method for pulling a single crystal (8) according to the present invention, which is carried out according to the method for pulling a single crystal (7), is characterized by the length of the seed crystal melted into the melt, which is 6 mm or more.

In the method for pulling a single crystal (8), since the length of the seed crystal melted into the melt is 6 mm or more, even if there is a dislocation portion where dislocation is induced by a thermal shock (where the dislocation exists), it can be almost melted and the residual of the seed crystal is allowed to include only a dislocation-free portion. As a result, the yield of the pulled single crystals can be more improved.

A method for pulling a single crystal (9) according to the present invention is characterized by bringing a seed crystal into contact with the melt, melting the front portion of the seed crystal into the melt, and then, pulling a single crystal.

In the method for pulling a single crystal (9), since the front portion of the seed crystal where dislocation occurs in contact with the melt is melted, the single crystal can be pulled using the dislocation-free portion (where almost no dislocation exists) of the seed crystal as a base. Accordingly, since the dislocation does not propagate to the pulled single crystal, the dislocation can be efficiently excluded even if the necking step is omitted. And since the necking step is not needed, it becomes unnecessary to hold a single crystal by a small neck, so that the diameter of the seed crystal is the smallest diameter for holding the single crystal. As long as the seed crystal has a sufficient strength, even a heavy single crystal can be pulled safely without caring about troubles such as falling. In addition, since a neck need not be formed, the seed crystal whose diameter is conventionally 12 mm or so, can be narrowed to 6 mm or so, leading to the reduction of the material cost required for the seed crystal.

A method for pulling a single crystal (10) according to the present invention is characterized by a melting speed of the seed crystal of 0.05–2 mm/min and a length of the seed crystal melted into the melt, which is the same as the diameter thereof or longer.

In the method for pulling a single crystal (10), since the melting speed of the seed crystal is 0.05–2 mm/min, the dislocation portion where dislocation occurs at the early stage (where dislocation is caused by a thermal stress in contact with the melt) and the dislocation portion where the initial dislocation propagates can be melted before the dislocation newly propagates by the melting. And since the length of the seed crystal melted into the melt is the same as the diameter thereof or longer, the dislocation portion where dislocation occurs at the early stage and the dislocation portion where the initial dislocation propagates can be melted, so that the seed crystal is allowed to have only an almost dislocation-free portion.

When the melting speed of the seed crystal is slower than 0.05 mm/min, it takes much time to melt the prescribed length, leading to the lower production efficiency of the whole. When the melting speed of the seed crystal is faster than 2 mm/min, the thermal stress caused by the melting becomes large, so that the propagation speed of the dislocation exceeds the melting speed. As a result, it becomes difficult to inhibit the dislocation from propagating.

When the length of the seed crystal melted into the melt is shorter than the diameter thereof, the dislocation sometimes remains, so that the later process of the pulling of a single crystal is sometimes unfavorably hindered.

BRIEF DESCRIPTION OF THE DRAWINGS

FIGS. 9(a)–(d) are diagrammatic partial side views showing a method for pulling a single crystal according to an embodiment of the present invention in the order of the steps.

DETAILED DESCRIPTION OF THE PREFERRED EMBODIMENTS

The embodiments of the seed crystals for pulling a single crystal and the methods for pulling a single crystal using the same according to the present invention are described below by reference to the Figures of the drawings. An apparatus used for the methods for pulling a single crystal according to the embodiments is not especially limited. An apparatus for pulling a single crystal used for the CZ method (FIG. 1) may be used, or an apparatus for pulling a single crystal used for the melting method may be used. The methods for pulling a single crystal according to the embodiments are described on the assumption that a heavy single crystal having a large diameter of 12 inches or more is pulled.

Figure 1:
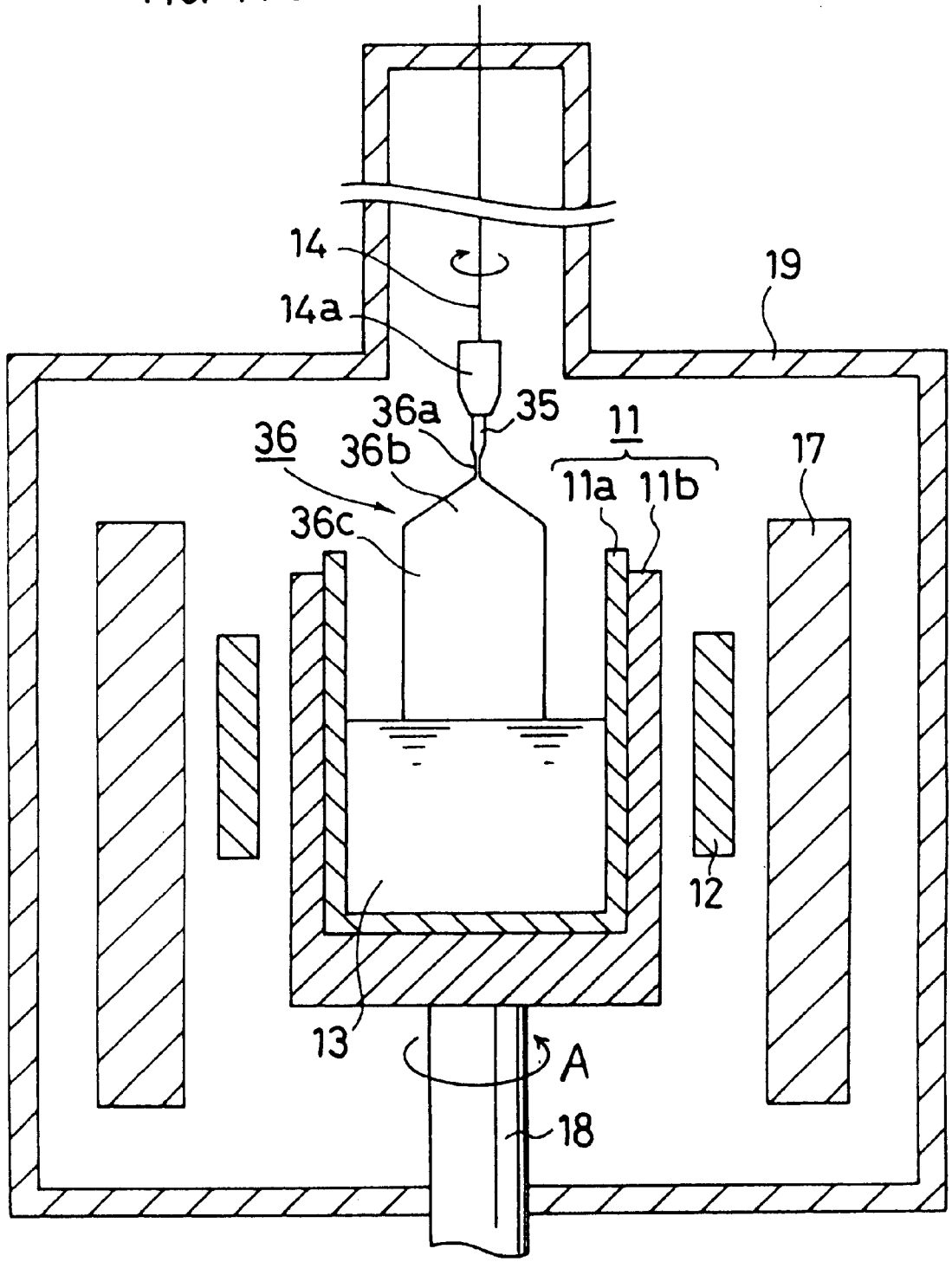
FIG. 1 is a diagrammatic sectional view showing an apparatus for pulling a single crystal used for the CZ method.
Figure 2A:
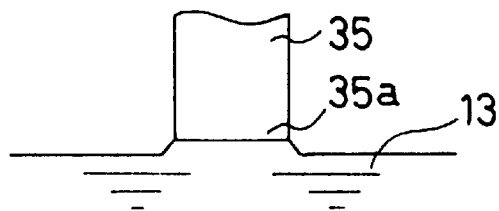
FIGS. 2(a)–(d) are partial magnified front views diagrammatically showing part of the steps of a conventional method for pulling a single crystal.
Figure 2B:
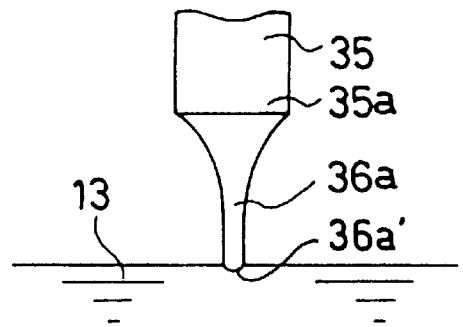
Figure 2C:
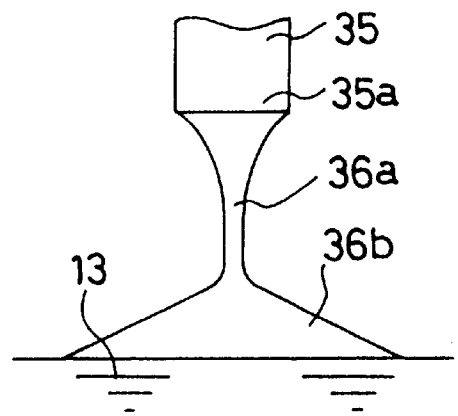
Figure 2D:
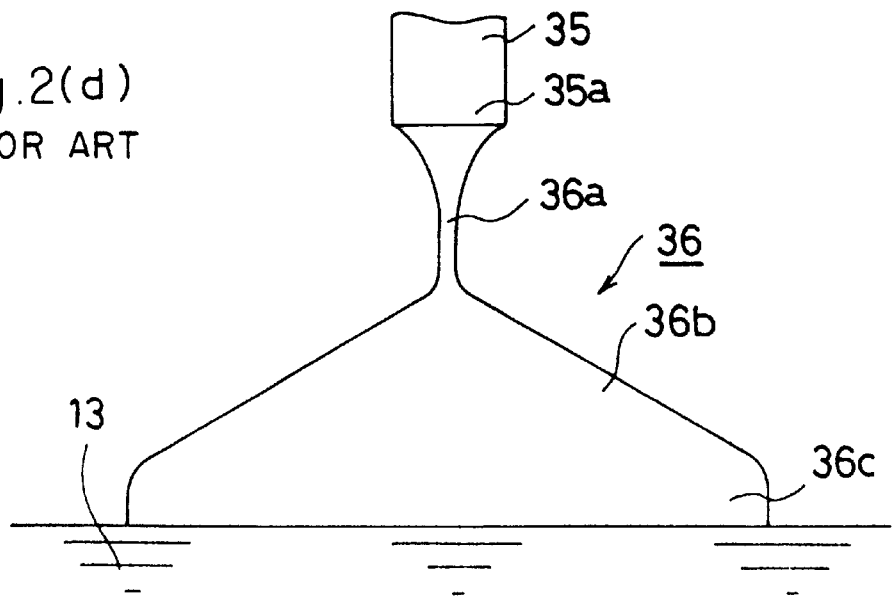

In the embodiments, since the cases wherein a single crystal is pulled using the apparatus for pulling a single crystal shown in FIG. 1 are described, the description of the apparatus for pulling a single crystal itself is omitted.

FIGS. 3(a)–(d) are partial magnified front views diagrammatically showing a seed crystal and the vicinity thereof in part of the steps in a method for pulling a single crystal according to an embodiment.

Figure 3A:
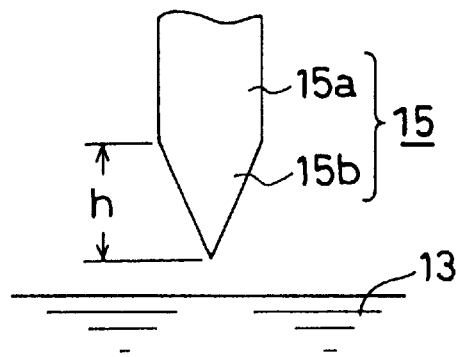
FIGS. 3(a)–(d) are partial magnified front views diagrammatically showing part of the steps of a method for pulling a single crystal according to an embodiment of the present invention.

In FIG. 3(a), part of a seed crystal 15 is shown. The seed crystal 15 includes a cylindrical body 15a and a conical front portion 15b. The diameter of the body 15a is preferably 6–30 mm, and the length (h) of the front portion 15b is preferably 5–100 mm. When the diameter of the body 15a is less than 6 mm, it is difficult to allow the front portion 15b to have a diameter of 6 mm or more in the melting of the seed crystal 15 carried out in the below-described step, so that it is difficult to support a single crystal 16 having a diameter of 12 inches or more and a weight of more than 300 kg. On the other hand, when the diameter of the body 15a is more than 30 mm, using such a big seed crystal 15 is economically disadvantageous. When the length (h) of the front portion 15b is less than 5 mm, there is the possibility of the induction of dislocation caused by a thermal stress to the seed crystal 15 in contact with the melt in the below-described step, while when the length (h) thereof is more than 100 mm, it takes much time to melt the front portion 15b.

The method for pulling a single crystal according to the embodiment is described below. The steps before the below-described steps are carried out in the same manner as described in the Prior Art.

While a pulling axis 14 (FIG. 1) is rotated on the same axis in the reverse direction of a support shaft 18 (FIG. 1) at a prescribed speed, the seed crystal 15 held by a seed chuck 14a (FIG. 1), having a cylindrical body 15a and a conical front portion 15b, is caused to descend close to a melt 13 and is preheated (FIG. 3(a)).

By spending 5–120 minutes or so on the preheating, the temperature of the front portion 15b of the seed crystal 15 rises. The temperature of part of the front portion 15b closer to the melt 13 becomes almost the same as that of the melt 13. The distance between the melt 13 and the lower end of the seed crystal 15 at that time is preferably 1–30 mm or so.

Figure 3B:
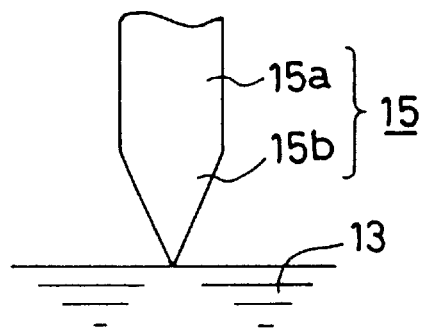

The seed crystal 15 is caused to descend and the front portion 15b of the seed crystal 15 is brought into contact with the surface of the melt 13 (FIG. 3(b)). Once in contact with the melt, since the temperature of the front portion 15b of the seed crystal 15 is almost the same as that of the melt 13, no thermal stress caused by the temperature difference occurs in the seed crystal 15, resulting in no induction of dislocation.

Figure 3C:
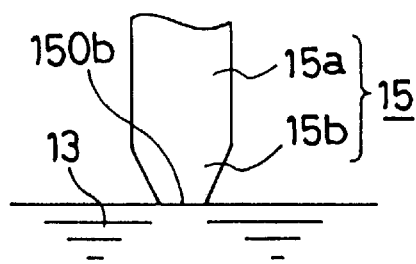
Figure 3D:
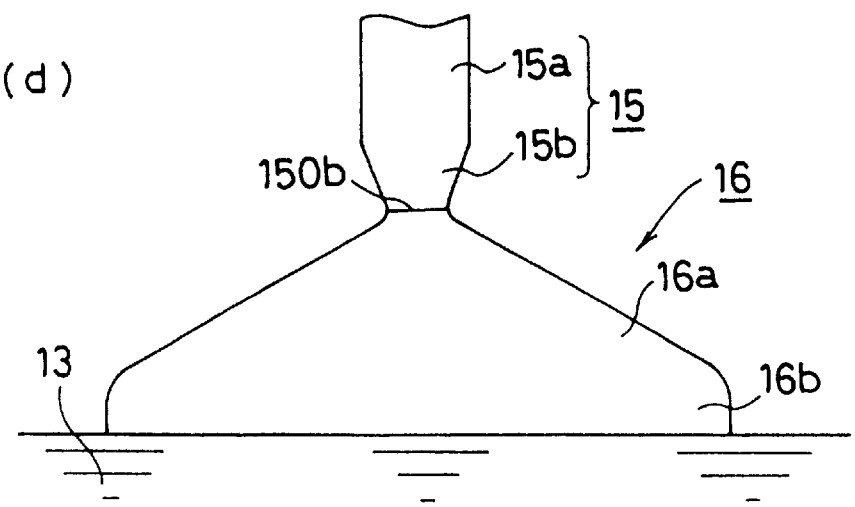

The seed crystal 15 is caused to descend at a speed of 0.5–2 mm/min so as to melt part of the front portion 15b of the seed crystal 15 (FIG. 3(c)). When the descending speed of the seed crystal 15 is slower than 0.5 mm/min, it takes too much time to melt the front portion 15b, while when the descending speed thereof is faster than 2 mm/min, it is difficult to completely melt the front portion 15b into the melt 13. Here, a base portion 150b of the front portion 15b, which is the residual in the melting of the front portion 15b, preferably has a diameter of 6 mm or more. When the diameter of the base portion 150b is less than 6 mm, it is difficult to support a heavy single crystal 16 having a main body 16b whose diameter is 12 inches or so and a weight of 300 kg or so.

With regulating the temperature of the melt 13 and without forming a neck, the shoulder formation step and the main body formation step are carried out. The single crystal 16 is made to grow to have a prescribed diameter (about 12 inches) at a prescribed pulling speed so as to form the shoulder 16a, and is pulled at a prescribed speed so as to form the main body 16b (FIG. 3(d)).

The single crystal 16 is pulled in the same manner as described in the Prior Art, is separated from the melt 13 and is cooled, which is the completion of the pulling of the single crystal 16.

FIGS. 4(a)–(d) are diagrammatic partial side views showing a seed crystal for pulling a single crystal and a method for pulling a single crystal using the same according to another embodiment of the present invention in the order of the steps.

Figure 4A:
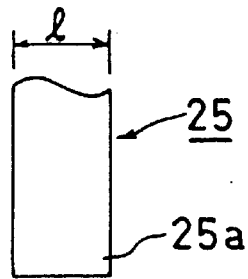
FIGS. 4(a)–(d) are diagrammatic partial side views showing a method for pulling a single crystal according to an embodiment of the present invention in the order of the steps.
Figure 4B:
Figure 4C:
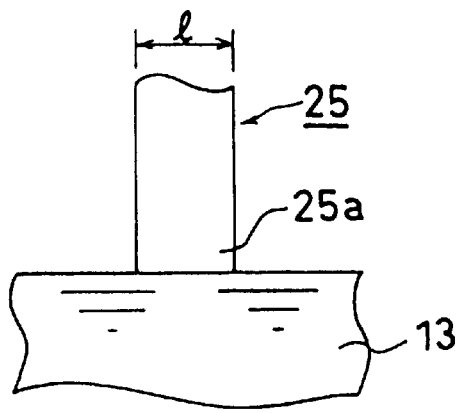
Figure 4D:
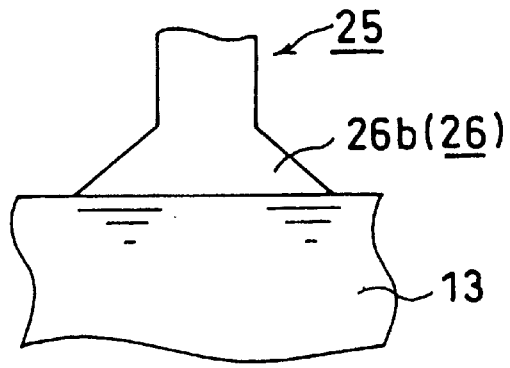

A seed crystal 25 having a diameter l of 6 mm or more is caused to descend close to a melt 13 and is preheated (FIG. 4(a)). The seed crystal 25 includes phosphorus (P) or the like as a dopant. The dopant concentration of the seed crystal 25 is chosen in the range of $1 \times 10^{19}$–$1 \times 10^{21}$/cm$^3$. Then, the seed crystal 25 is brought into contact with the surface of the melt 13 (FIG. 4(b)). Dislocation (not shown) is induced from the front portion 25a of the seed crystal 25 upward in the seed crystal 25 by a thermal stress which works in contact with the melt. The seed crystal 25 is caused to descend at a prescribed speed so as to dip and melt the front portion 25a thereof (where the dislocation is induced) into the melt 13. The length L of the seed crystal 25 melted into the melt 13 is 6 mm or more (FIG. 4(c)). Accordingly, by melting the front portion 25a of the seed crystal 25 into the melt 13, the residual of the seed crystal 25 is allowed to include only a dislocation-free portion. Then, the necking step conventionally carried out is omitted and the shoulder formation step follows, wherein the single crystal 26 is made to grow to have a prescribed diameter by pulling at a prescribed pulling speed, leading to the formation of a shoulder 26b (FIG. 4(d)). The main body formation step follows, wherein a main body is formed.

Figure 5:
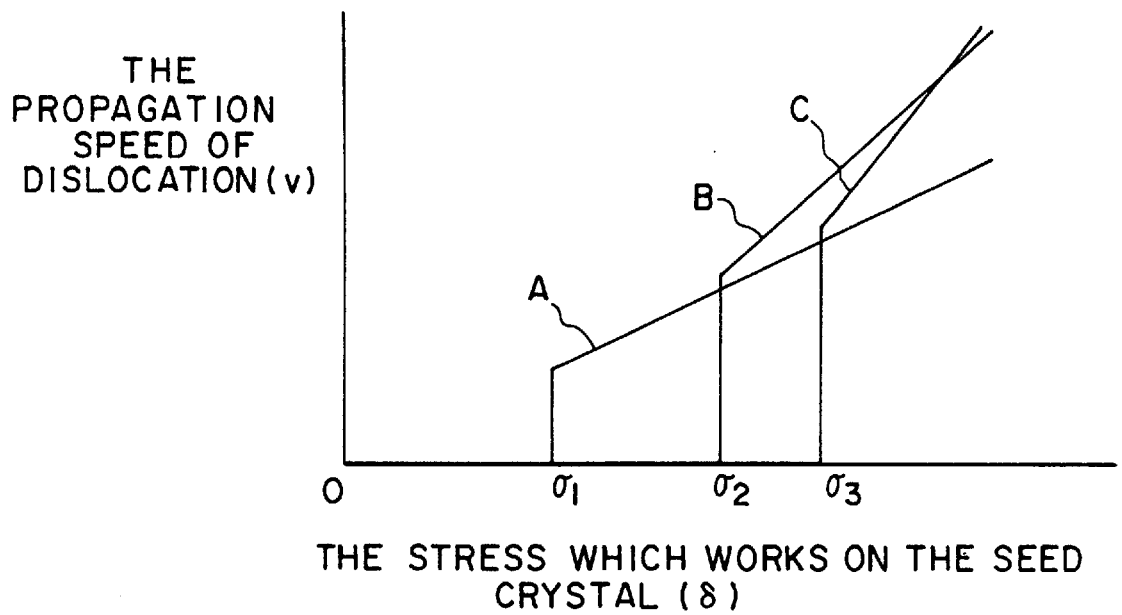
FIG. 5 is a graph indicating the relationship between the stress which works on a seed crystal and the speed at which dislocation existing in the seed crystal propagates by the stress.

In general, the relationship as shown in FIG. 5 exists between the stress which works on the seed crystal 25 and the speed at which the dislocation induced to the seed crystal 25 propagates by the stress.

In FIG. 5, the axis of ordinates indicates the propagation speed of dislocation (v), while the axis of abscissas indicates the stress which works on the seed crystal ($\delta$).

Graph A indicates the case wherein a seed crystal has a general dopant concentration ($1 \times 10^{15}$/cm$^3$), while Graphs B and C indicate the cases wherein the seed crystals 25, including phosphorus (P) as a dopant, for example, have a dopant concentration of $1 \times 10^{19}$/cm$^3$ or $1 \times 10^{21}$/cm$^3$, respectively.

In the case wherein the seed crystal has the general dopant concentration (Graph A), the dislocation propagates when a stress of $\delta_1$ or more works (the propagation speed of dislocation becomes 0 or more), while in the case wherein the seed crystal has a dopant concentration of $1 \times 10^{19}$/cm$^3$ (Graph B), the dislocation does not propagate as long as a stress of $\delta_2$ does not work. In the case wherein the seed crystal has a dopant concentration of $1 \times 10^{21}$/cm$^3$ (Graph C), the dislocation does not propagate as long as a stress of $\delta_3$ does not work. Here, the magnitude of the stress is $\delta_1 < \delta_2 < \delta_3$. As a result, the higher the dopant concentration is, the better the dislocation can be inhibited from propagating.

Using the seed crystal for pulling a single crystal 25, the dopant concentration of P ranges from $1 \times 10^{19}$/cm$^3$ to $1 \times 10^{21}$/cm$^3$, which is higher than the general dopant concentration ($1 \times 10^{15}$/cm$^3$), so that the stress level necessary for the dislocation induced in contact with the melt to propagate upward in the seed crystal 25 can be made higher than usual. That is, the dislocation does not propagate, as long as a stress of much higher level does not work. Therefore, by melting the portion where the dislocation is induced in contact with the melt (the front portion 25a) into the melt at a prescribed speed, the portion where the dislocation is induced (the front portion 25a) can be excluded without propagating the dislocation, so that the single crystal can be pulled using the dislocation-free seed crystal as a base. As a result, the Dislocation Free rate of the pulled single crystals can be made higher.

Since the seed crystal 25 has a diameter l of 6 mm or more, it has a sufficient strength, which is calculated from the silicon strength (about 16 kgf/mm$^2$), so that even a heavy single crystal 26 having a weight of 300 kg or so, for example, can be pulled safely without caring about troubles such as falling of the single crystal 26 caused by breakage of the seed crystal 25.

In the method for pulling a single crystal using the seed crystal 25, since the front portion 25a of the seed crystal 25 having the dislocation which occurs in contact with the melt is melted, the single crystal 26 can be pulled using the seed crystal 25 including only a dislocation-free portion as a base. Therefore, the dislocation is not induced to the pulled single crystal 26 so that the necking step can be omitted. Since the necking step is not necessary, it becomes unnecessary to hold the single crystal 26 by a small neck 36a (FIG. 2). Accordingly, the diameter l of the seed crystal is the smallest diameter for holding the single crystal 26, so that even a heavy single crystal 26 can be pulled safely without caring about troubles such as falling. Furthermore, since a neck 36a need not be formed, the seed crystal whose diameter is conventionally 12 mm or so, can be narrowed to 6 mm or so, leading to the reduction of the material cost required for the seed crystal.

By making the length L of the seed crystal 25 melted into the melt the same as the diameter thereof or longer, most of the portion where the dislocation is induced can be melted, so that the residual of the seed crystal 25 is allowed to include only a dislocation-free portion. The single crystal 26 can be pulled using the seed crystal 25 including only a dislocation-free portion, leading to the improvement in the yield of the single crystals 26.

In the present embodiment, the case wherein phosphorus (P) is used as a dopant and the dopant concentration of the seed crystal 25 ranges from $1 \times 10^{19}/cm^3$ to $1 \times 10^{21}/cm^3$, is exemplified. However, it is not limited to that. In another embodiment, using boron (B), for example, as a dopant, the dopant concentration of the seed crystal 25 may range from $5 \times 10^{19}/cm^3$ to $6 \times 10^{20}/cm^3$.

FIGS. 6(a)–(d) are diagrammatic partial side views showing a seed crystal for pulling a single crystal and a method for pulling a single crystal using the seed crystal according to another embodiment of the present invention in the order of the steps.

The seed crystal 45 has a diameter l of 6 mm or more and on the side portion thereof, two concaves 45p and 45q having a maximum depth larger than the radius of the seed crystal (l/2) are formed in symmetrical positions to a central axis 45x of the seed crystal 45.

Figure 6A:
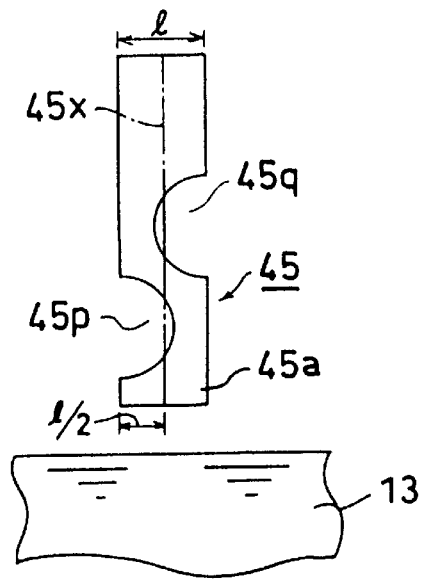
FIGS. 6(a)–(d) are diagrammatic partial side views showing a method for pulling a single crystal according to an embodiment of the present invention in the order of the steps.
Figure 6B:
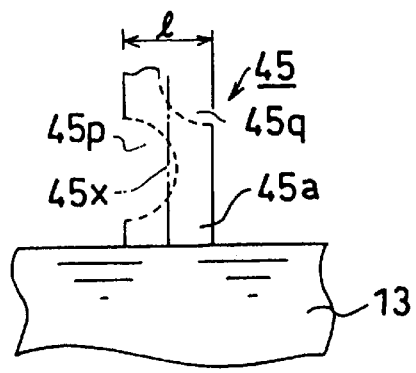
Figure 6C:
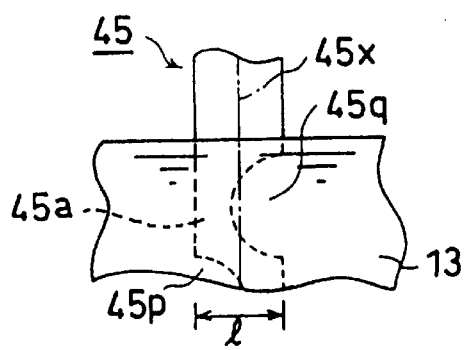
Figure 6D:
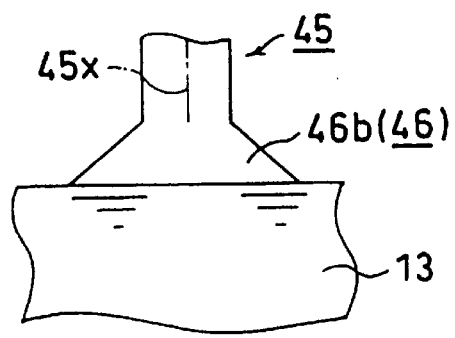

In order to pull a single crystal 46 using the seed crystal 45, the seed crystal 45 is caused to descend close to a melt 13 and is preheated (FIG. 6(a)). The seed crystal 45 is brought into contact with the surface of the melt 13 (FIG. 6(b)). Dislocation (not shown) is induced to the front portion 45a of the seed crystal 45 by a thermal stress which works in contact with the melt. Then, the seed crystal 45 is caused to descend at a prescribed speed so as to dip and melt the front portion 45a thereof to above the concaves 45p and 45q into the melt 13 (FIG. 6(c)). Accordingly, by melting the front portion 45a of the seed crystal 45 into the melt 13, the residual of the seed crystal 45 is allowed to include only a dislocation-free portion. Then, the necking step conventionally carried out is omitted and the shoulder formation step follows, wherein the single crystal 46 is made to grow to have a prescribed diameter by pulling at a prescribed speed, leading to the formation of a shoulder 46b (FIG. 6(d)). The main body formation step follows, wherein a main body is formed.

In general, the pulling of a silicon single crystal is carried out in the [100] direction and the single crystal grows on the (100) plane. On the other hand, the dislocation induced to the (100) plane easily propagates along the (11-1) plane. The (100) plane and the (11-1) plane make an angle of 54.7°, so that the dislocation caused in contact with the melt propagates toward the free surface of the concave 45p (45q) and passes through the surface of the concave 45p or 45q outward.

Using the seed crystal for pulling a single crystal 45, since the concaves 45p and 45q having a maximum depth larger than the radius of the seed crystal (l/2) are formed, the dislocation induced in contact with the melt propagates toward the free surfaces of the concaves 45p and 45q, from the property of the propagation direction. And since the maximum depth of the concaves 45p and 45q is larger than the radius of the seed crystal (l/2), most of the propagating dislocation passes through the free surfaces. Even when some of the dislocation remains without passing through the free surface of one concave 45p, the remaining dislocation passes through the free surface of the other concave 45q, since the concave 45q is formed in the symmetrical position to the central axis 45x, that is, in the direction to which the remaining dislocation propagates. Therefore, by melting the front portion 45a till above the concave 45q into the melt 13 at a moderate speed, the dislocation portion can be certainly excluded, so that the single crystal 46 can be pulled using the dislocation-free seed crystal 45 as a base. As a result, the Dislocation Free rate of the pulled single crystals 46 can be made higher.

Since the seed crystal 45 has a diameter l of 6 mm or more, it has sufficient strength, which is calculated from the silicon strength (about 16 kgf/mm²), so that even a heavy single crystal 46 having a weight of 300 kg or so, for example, can be pulled safely without caring about troubles such as falling of the single crystal 46 caused by breakage of the seed crystal 45.

In the method for pulling a single crystal using the seed crystal 45, since the front portion 45a of the seed crystal 45 having a dislocation portion is melted so as to allow the dislocation to pass through the free surfaces of the concaves 45p and 45q, a single crystal 46 can be pulled using the seed crystal 45 including only a dislocation-free portion as a base. Therefore, the dislocation is not induced to the pulled single crystal 46 so that the necking step can be omitted. Since the necking step is not necessary, it becomes unnecessary to hold the single crystal 46 by a small neck 36a (FIG. 2). Accordingly, the diameter l of the seed crystal 45 is the smallest diameter for holding the single crystal 46, so that even a heavy single crystal 46 can be pulled safely without caring about troubles such as falling. Furthermore, since a neck 36a need not be formed, the seed crystal whose diameter is conventionally 12 mm or so, can be narrowed to 6 mm or so, leading to the reduction of the material cost required for the seed crystal.

In the present embodiment, the case wherein two concaves 45p and 45q are formed on the seed crystal 45 is exemplified. However, it is not limited to that. In another embodiment, only one concave 45p may be formed, or in still another embodiment, three or more concaves may be formed.

FIGS. 7(a)–(d) are diagrammatic partial side views showing a seed crystal for pulling a single crystal and a method for pulling a single crystal using the seed crystal according to an embodiment of the present invention in the order of the steps.

Figure 7A:
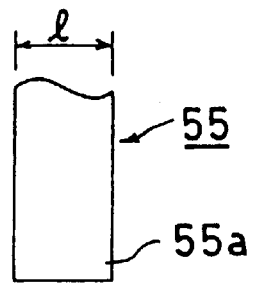
FIGS. 7(a)–(d) are diagrammatic partial side views showing a method for pulling a single crystal according to an embodiment of the present invention in the order of the steps.
Figure 7B:
Figure 7C:
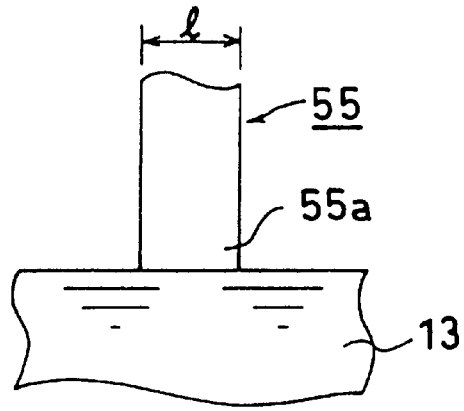
Figure 7D:
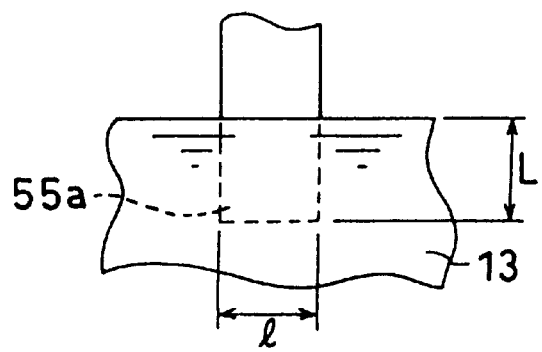

A seed crystal 55 having a diameter l of 6 mm or more is caused to descend close to a melt 13 and is preheated (FIG. 7(a)). The oxygen content of the seed crystal 55 is chosen in the range of $13 \times 10^{17}$–$18 \times 10^{17}/cm^3$. The seed crystal 55 is brought into contact with the surface of the melt 13 (FIG.

7(b)). Dislocation (not shown) is induced from the front portion 55a of the seed crystal 55 upward in the seed crystal 55 by a thermal stress which works in contact with the melt. Then, the seed crystal 55 is caused to descend at a prescribed speed so as to dip and melt the front portion 55a thereof (where the dislocation is induced) into the melt 13. The length L of the seed crystal 55 melted into the melt 13 is 6 mm or more (FIG. 7(c)). Accordingly, by melting the front portion 55a of the seed crystal 55 into the melt 13, the residual of the seed crystal 55 is allowed to include only a dislocation-free portion. Then, the necking step conventionally carried out is omitted and the shoulder formation step follows, wherein a single crystal 56 is made to grow to have a prescribed diameter by pulling at a prescribed speed, leading to the formation of a shoulder 56b (FIG. 7(d)). The main body formation step follows, wherein a main body is formed.

Figure 8:
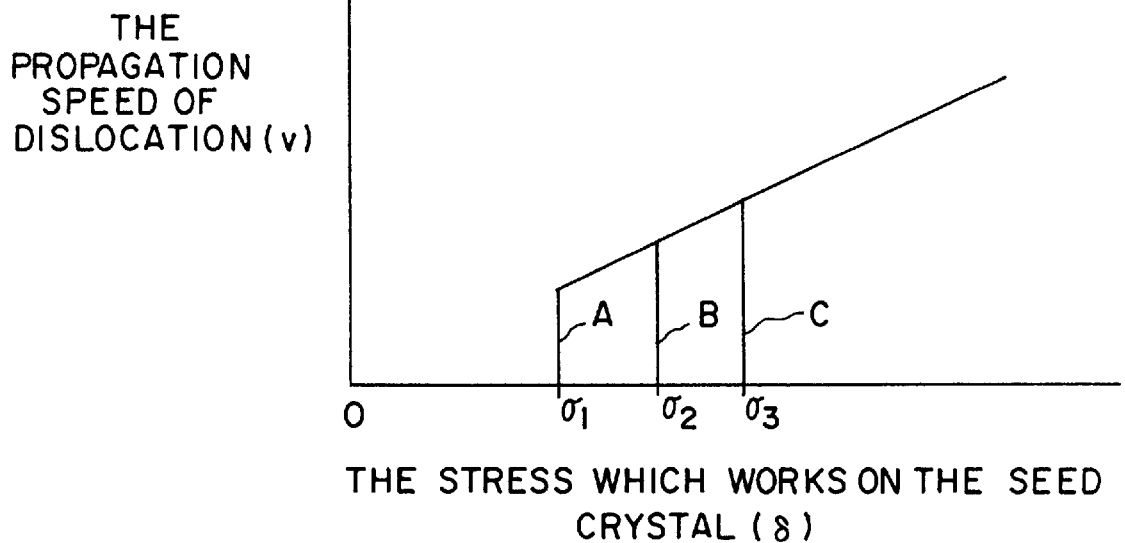
FIG. 8 is a graph indicating the relationship between the stress which works on a seed crystal and the speed at which dislocation existing in the seed crystal propagates by the stress.

In general, the relationship as shown in FIG. 8 exists between the stress which works on the seed crystal 55 and the speed at which the dislocation induced to the seed crystal 55 propagates by the stress.

In FIG. 8, the axis of ordinates indicates the propagation speed of dislocation (v), while the axis of abscissas indicates the stress which works on the seed crystal (δ).

Graph A indicates the case wherein a seed crystal has a general oxygen content ($11 \times 10^{17}$/cm$^3$), while Graphs B and C indicate the cases wherein the seed crystals 55 have an oxygen content of $13 \times 10^{17}$/cm$^3$ or $18 \times 10^{17}$/cm$^3$, respectively.

In the case wherein the seed crystal has the general oxygen content (Graph A), the dislocation propagates when a stress of $\delta_1$ or more works (the propagation speed of dislocation becomes 0 or more), while in the case wherein the seed crystal has an oxygen content of $13 \times 10^{17}$/cm$^3$ (Graph B), the dislocation does not propagate, as long as a stress of $\delta_2$ does not work. In the case wherein the seed crystal has an oxygen content of $18 \times 10^{17}$/cm$^3$ (Graph C), the dislocation does not propagate, as long as a stress of $\delta_3$ does not work. Here, the magnitude of the stress is $\delta_1 < \delta_2 < \delta_3$. As a result, the higher the oxygen content is, the better the dislocation can be inhibited from propagating.

Using the seed crystal for pulling a single crystal 55, the oxygen content ranges from $13 \times 10^{17}$/cm$^3$ to $18 \times 10^{17}$/cm$^3$, which is higher than the general oxygen content ($11 \times 10^{17}$/cm$^3$), so that the stress level necessary for the dislocation induced in contact with the melt to propagate upward in the seed crystal 55 can be made higher than usual. That is, the dislocation does not propagate, as long as a stress of much higher level than usual does not work. Therefore, by melting the portion where the dislocation is induced in contact with the melt (the front portion 55a) into the melt at a prescribed speed, the portion where the dislocation is induced (the front portion 55a) can be excluded without propagating the dislocation, so that the single crystal can be pulled using the dislocation-free seed crystal as a base. As a result, the Dislocation Free rate of the pulled single crystals can be made higher.

Since the seed crystal 55 has a diameter l of 6 mm or more, it has a sufficient strength, which is calculated from the silicon strength (about 16 kgf/mm$^2$), so that even a heavy single crystal 56 having a weight of 300 kg or so, for example, can be pulled safely without caring about troubles such as falling of the single crystal 56 caused by breakage of the seed crystal 55.

In the method for pulling a single crystal using the seed crystal 55, since a single crystal 56 can be pulled using the seed crystal 55 including only a dislocation-free portion as a base, the dislocation is not induced to the pulled single crystal 56 so that the necking step can be omitted. Since the necking step is not necessary, it becomes unnecessary to hold the single crystal 56 by a small neck 36a (FIG. 2). Accordingly, the diameter l of the seed crystal is the smallest diameter for holding the single crystal 56, so that even a heavy single crystal 56 can be pulled safely without caring about troubles such as falling. Furthermore, since a neck 36a need not be formed, the seed crystal whose diameter is conventionally 12 mm or so, can be narrowed to 6 mm or so, leading to the reduction of the material cost required for the seed crystal.

By making the length L of the seed crystal 55 melted into the melt 6 mm or more, most of the portion where the dislocation is induced can be melted, so that the residual of the seed crystal 55 includes only a dislocation-free portion. The single crystal 56 can be pulled using the seed crystal 55 including only a dislocation-free portion, leading to the improvement in the yield of the single crystals 56.

FIGS. 9(a)–(d) are diagrammatic side views showing the front portion in a method for pulling a single crystal according to another embodiment of the present invention in the order of the steps.

A seed crystal 65 having a desired diameter is caused to descend close to a melt 13 and is preheated (FIG. 9(a)). The seed crystal 65 is brought into contact with the surface of a melt 13. At this time, dislocation (not shown) is easily caused in the seed crystal 65 in the range in length of the diameter l thereof from the front plane 65a thereof by a thermal stress which works in contact with the melt (FIG. 9(b)). Then, the seed crystal 65 is caused to descend at a speed of 0.05–2 mm/min so as to melt the seed crystal 65 in the range of a prescribed length L longer than the diameter l thereof (hereinafter, simply referred to as the front portion 65A) into the melt 13. Accordingly, by melting the front portion 65A into the melt 13, the residual of the seed crystal 65 becomes a dislocation-free portion 65B (FIG. 9(c)). Then, the necking step conventionally carried out is omitted and the shoulder formation step follows, wherein a single crystal 66 is made to grow to have a prescribed diameter by pulling at a prescribed speed, leading to the formation of a shoulder 66b (FIG. 9(d)). The main body formation step follows, wherein a main body is formed.

In the above method for pulling a single crystal, since the front portion 65A of the seed crystal 65 having the dislocation which occurs in contact with the melt is melted, the single crystal 66 can be pulled using the seed crystal 65 including only a dislocation-free portion as a base. Therefore, the dislocation is not induced to the pulled single crystal 66, so that the dislocation can be efficiently excluded even if the necking step is omitted. Since the necking step is not necessary, it becomes unnecessary to hold the single crystal 66 by a small neck 36a (FIG. 2). Accordingly, the diameter l of the seed crystal 65 is the smallest diameter for holding the single crystal 66, so that even a heavy single crystal 66 can be pulled safely without caring about troubles such as falling. Furthermore, since a neck 36a need not be formed, the seed crystal 65 whose diameter is conventionally 12 mm or so, can be narrowed to 6 mm or so, leading to the reduction of the material cost required for the seed crystal.

In general, in the melting of a seed crystal, the below-described relationship exists among melting speed, heat distribution, seed crystal diameter, magnitude of thermal stress, and propagation speed of dislocation. The faster the melting speed becomes, the larger the heat distribution and the magnitude of thermal stress become and the faster the propagation speed of dislocation becomes. The smaller the seed crystal diameter is, the smaller the heat distribution and the magnitude of thermal stress become and the slower the propagation speed of dislocation becomes.

When the melting speed is higher than the propagation speed of dislocation and the speed difference is adequately chosen, the whole portion where the dislocation is induced in contact of the seed crystal with the melt, can be melted. In order to minimize the proceeding of the dislocation, the diameter of the seed crystal is preferably the smallest in the range where the seed crystal has a sufficient strength for holding the pulled single crystal.

In general, the pulling of a silicon single crystal is carried out in the [100] direction and the single crystal grows on the (100) plane. On the other hand, the dislocation induced to the (100) plane easily propagates along the (11-1) plane. The (100) plane and the (11-1) plane make an angle of 54.73°, so that it can be considered that the range where the dislocation easily propagates is almost the same as the diameter.

In the above method for pulling a single crystal, since the melting speed of the seed crystal 65 is 0.05–2 mm/min, the portion where the initial dislocation is induced in contact with the melt can be melted before the dislocation newly propagates by the melting. Since the length of the seed crystal 65 melted into the melt is the same as the diameter thereof or longer, the whole of the initial dislocation portion and the portion to which the initial dislocation propagates can be melted, so that the seed crystal 65 is allowed to include almost only a dislocation-free portion.

When the melting speed is slower than 0.05 mm/min, it takes much time to melt the prescribed length of the seed crystal 65, leading to the lower production efficiency. When the melting speed is faster than 2 mm/min, the thermal stress caused by the melting becomes large. The propagation speed of dislocation becomes faster than the melting speed, so that it becomes difficult to inhibit the dislocation from propagating.

When the length of the seed crystal 65 melted into the melt is shorter than the diameter thereof, the dislocation remains so that it is impossible to promote the later process of forming a single crystal.

EXAMPLES AND COMPARATIVE EXAMPLES

The seed crystals for pulling a single crystal and the methods for pulling a single crystal using the same according to Examples are described below. As Comparative Examples, the cases wherein a single crystal is pulled by a conventional method using a conventional apparatus for pulling a single crystal are also described below. The conditions are shown below.

Common conditions to Example 1 and Comparative Examples 1 and 2

Shape of pulled single crystal
Diameter: about 300 mm (12 inches), Length: about 1000 mm
Weight: about 270 kg
Prepared quantity of material for crystal: 300 kg
Atmosphere in chamber 19: Ar atmosphere
Flow of Ar: 80 liter per minute
Pressure: $1.33 \times 10^3$ Pa
Rotation speed of pulling axis 14: 20 rpm
Rotation speed of crucible 11: 5 rpm
Number of pulls: ten times in each Example and Comparative Example Conditions in Example 1
Shape of seed crystal 15: having a cylindrical body 15a and a conical front portion 15b (FIG. 3)
Diameter of body 15a: 12 mm, Length of body 15a: 70 mm
Length of front portion 15b (h): 60 mm
1. Position of lower end of seed crystal 15 in preheating: 1 mm above melt 13
2. Descending speed of seed crystal 15 after contact with melt: 0.7 mm/min
3. Diameter of base portion 150b of front portion 15b remaining after melted: 10 mm
4. Pulling speed of single crystal 16 in shoulder 16a formation: 0.3 mm/min
5. Pulling speed of single crystal 16 in main body 16b formation: 0.5 mm/min Conditions in Comparative Example 1
Shape of seed crystal 35: cylindrical
Diameter: 12 mm, Length: 70 mm
1. Position of bottom portion 35a of seed crystal 35 in preheating: 1 mm above melt 13
2. Pulling speed in neck 36a formation after contact with melt: 3.0 mm/min
Smallest diameter of neck 36a: 4 mm
3. Pulling speed in shoulder 36b formation: 0.3 mm/min
4. Pulling speed in main body 36c formation: 0.5 mm/min Conditions in Comparative Example 2
Shape of seed crystal 35: cylindrical
Diameter: 12 mm, Length: 70 mm
1. Position of bottom portion 35a of seed crystal 35 in preheating: 1 mm above melt 13
2. Pulling speed in neck 36a formation after contact with melt: 4.0 mm/min
Smallest diameter of neck 36a: 10 mm
3. Pulling speed in shoulder 36b formation: 0.3 mm/min
4. Pulling speed in main body 36c formation: 0.5 mm/min How to examine DF (Dislocation Free) rate of pulled single crystal The pulled single crystals 16 and 36 were sliced in parallel to the growth direction (length direction), and X-ray topographies of the obtained single crystals 16 or 36 were measured, from which the DF rate was judged. That is, the single crystals 16 or 36, in which dislocation was found even slightly from the X-ray topographies, were judged as having dislocation. The rate of dislocation-free single crystals (DF) in ten pulled single crystals was examined by the above measurement.

Results of Example 1 and Comparative Examples 1 and 2

The DF rates and the number of falls of the single crystals 16 and 36 in Example 1 and Comparative Examples 1 and 2 are shown in Table 1.

|  | DF rate (%) | Number of falls |
| --- | --- | --- |
| Example 1 | 90% (9/10) | 0 (/10) |
| Comparative Example 1 | 90% (9/10) | 8 (/10) |
| Comparative Example 2 | 0% (0/10) | 0 (/10) |

As obvious from the results shown in Table 1, in Example 1, the DF rate of the pulled single crystals 16 was 90% (9/10). Little dislocation occurred due to no induction of the dislocation to the seed crystals 15, though the single crystals 16 were pulled without forming a neck 36a (FIG. 2). Since the diameters of the front portions 15b of the seed crystals 15 after melted were 10 mm, sufficiently large, the number of falls was 0/10.

On the other hand, in Comparative Example 1, since the diameters of the seed crystals 35 were narrowed to make the neck 36a having a diameter of 4 mm, the DF rate was favorably 90% (9/10). But the single crystals 36 could not be supported sufficiently, resulting in the number of falls of 8/10, that is, the falls of most of the single crystals 36. In Comparative Example 2, since the diameters of the necks 36a were 10 mm, sufficiently large, the number of falls was 0/10. But since the dislocation induced to the seed crystals 35 could not be excluded, the DF rate was 0% (0/10), that is, the dislocation occurred in all of the single crystals 36.
Common conditions to Examples 2 and 3, and Comparative Examples 3 and 4

The common growing conditions to each pulling of a single crystal are shown in Table 2.

TABLE 2

| Size of single crystal | 12 inches Diameter × 1000 mm Length, 300 kg |
|---|---|
| Material for single crystal | High purity polycrystal of Si |
| Heating method | Direct-current resistance heating |
| Atmosphere | 1333.2 Pa. Ar (80 l/min) |
| Rotation speed of single crystal | 20 rpm (reverse to crucible) |
| Rotation speed of crucible | 5 rpm (reverse to single crystal) |

Example 2

In Example 2, a single crystal 26 was pulled by the method shown in FIG. 4 and on the conditions shown in Table 2 as described below. A seed crystal 25 included phosphorus (P) as a dopant and the dopant concentration was $2 \times 10^{20}/cm^3$.

The seed crystal 25 having a diameter of about 10 mm was caused to descend close to a melt 13 and was preheated. The seed crystal 25 was brought into contact with the surface of the melt 13 and was partially melted into the melt 13. The seed crystal 25 was caused to descend at a speed of 0.2 mm/min so as to dip the front portion 25a of the seed crystal 25 and melt the seed crystal 25 in the range of about 20 mm from the front portion 25a thereof into the melt 13. Then, the seed crystal 25 was pulled at a pulling speed of about 0.3 mm/min and by regulating the temperature of a heater 12, a shoulder 26b of the single crystal 26 was formed in the range of 100 mm below from the bottom plane of the seed crystal and was made to grow to have a diameter of about 12 inches. A main body having a diameter of 12 inches was made to grow to have a length of about 1000 mm at a pulling speed of 0.5 mm/min.

The DF rate of the single crystals 26 produced by the method according to Example 2 was 9/10. That is, no dislocation was found in nine out of ten pulled single crystals. The number of falls of the single crystals 26 was 0/10, that is, no falls of the single crystals 26 occurred.

Example 3

In Example 3, except for using a seed crystal 25 having a diameter of 6 mm, the other conditions and the method were the same as those in Example 2.

The DF rate of the single crystals 26 produced by the method according to Example 3 was 9/10. That is, no dislocation was found in nine out of ten pulled single crystals. The number of falls of the single crystals 26 was 0/10, that is, no falls of the single crystals 26 occurred.

Comparative Example 3

In Comparative Example 3, a single crystal 36 was pulled by the method shown in FIG. 4 and on the conditions shown in Table 2. Since the method for pulling the single crystal 36 is the same as those in Examples 2 and 3 except for the dopant concentration of the seed crystal 35, the description is omitted. The seed crystal 35 included phosphorus (P) as a dopant and the dopant concentration was $1 \times 10^{15}/cm^3$.

The DF rate of the single crystals 36 produced by the method according to Comparative Example 3 was 6/10. That is, no dislocation was found in six out of ten pulled single crystals. The number of falls of the single crystals 36 was 0/10, that is, no falls of the single crystals 36 occurred.

Comparative Example 4

In Comparative Example 4, a single crystal 36 was pulled by the method shown in FIG. 2 and on the conditions shown in Table 2. A seed crystal 35 included phosphorus (P) as a dopant and the dopant concentration was $2 \times 10^{20}/cm^3$, the same as those in Examples 2 and 3.

The seed crystal 35 having a diameter of about 18 mm was caused to descend close to a melt 13 and was preheated. The seed crystal 35 was brought into contact with the surface of the melt 13 and was partially melted into the melt 13. The seed crystal 35 was pulled at a speed of about 3 mm/min with regulating the temperature of a heater 12 so as to form a neck 36a having a diameter of about 10 mm and a length of about 100 mm. Then, the seed crystal 35 was pulled at a pulling speed of about 0.3 mm/min and by regulating the temperature of the heater 12, a shoulder 36b of the single crystal 36 was formed in the range of 100 mm below from the lower end of the neck 36a and was made to grow to have a diameter of about 12 inches. A main body 36c having a diameter of 12 inches was made to grow to have a length of about 1000 mm at a pulling speed of 0.5 mm/min.

The DF rate of the single crystals 36 produced by the method according to Comparative Example 4 was 0/10. That is, the dislocation was found in all of the pulled single crystals. On the other hand, the number of falls of the single crystals 36 was 0/10, that is, no falls of the single crystals 36 occurred.

As obvious from the above results, using the seed crystal 25 according to Example 2, the dopant concentration of P is $2 \times 10^{20}/cm^3$, which is higher than the general dopant concentration of P ($1 \times 10^{15}/cm^3$), so that the stress level necessary for the dislocation induced in contact with the melt to propagate upward in the seed crystal 25 could be made higher than usual. That is, since the dislocation did not propagate, as long as a higher stress than usual did not work, the portion where the dislocation was induced (the front portion 25a) could be excluded without propagating the dislocation by melting the portion where the dislocation was induced in contact with the melt (the front portion 25a) into the melt at a moderate speed and the single crystal 26 could be pulled using the dislocation-free seed crystal as a base. Therefore, the Dislocation Free rate of the pulled single crystals 26 could be made higher.

In the method for pulling a single crystal 26 according to Example 2, since the necking step was not necessary, it became unnecessary to hold a single crystal 26 by a small neck 36a (FIG. 2), so that the diameter of the seed crystal (10 mm) was the smallest diameter for holding the single crystal 26. Therefore, even a heavy single crystal 26 (300 kg) could be pulled safely without caring about troubles such as falling.

Furthermore, since the length L of the seed crystal 25 melted into the melt was 20 mm or more, longer than the diameter of the seed crystal 25 most of the portion where the dislocation was induced could be melted so as to allow the residual of the seed crystal 25 to include only a dislocation-free portion. By pulling the single crystal 26 using the seed crystal 25 including only the dislocation-free portion, the yield of the single crystals 26 could be improved.

Using the seed crystal 25 according to Example 3, since the seed crystal 25 has a diameter l of 6 mm or more, it has a sufficient strength, which is calculated from the silicon strength (about 16 kgf/mm$^2$), so that even a heavy single crystal having a weight of 300 kg or so could be pulled safely without caring about troubles such as falling of the single crystal 26 caused by breakage of the seed crystal 25. And since the diameter of the seed crystal 25 which is conventionally 12 mm or so, was narrowed to 6 mm or so, the seed crystal 25 became a quarter in volume, leading to the reduction of the material cost required for the seed crystal 25.

On the other hand, using the seed crystal 35 according to Comparative Example 3, almost the same effects were obtained as those in the Examples 2 and 3, but since the dopant concentration was 1×10$^{15}$/cm$^3$, the same as a conventional one, the yield of the products could not approach those in the Examples 2 and 3.

Using the seed crystal 35 according to Comparative Example 4, although the dopant concentration (2×10$^{20}$/cm$^3$) was the same as those in the Examples 2 and 3, the dislocation occurred in all of the pulled single crystals 36. It is considered that the dislocation existed in the seed crystal 35 because the melting step shown in FIG. 4 was not carried out, and that the dislocation existing in the seed crystal 35 could not pass through because of the large neck 36a having a diameter of 10 mm.

Common conditions to Examples 4 and 5, and Comparative Examples 5–8

The common conditions are the same as the conditions shown in Table 2.

Example 4

In Example 4, a single crystal 46 was pulled by the method shown in FIG. 6 and on the conditions shown in Table 2 as described below.

A seed crystal 45 having a diameter of 10 mm and a length of 180 mm was used, and on the side portion thereof, concaves 45p and 45q were formed by scraping with a whetstone having diamond grains so that they had the maximum depth of 6 mm. The concaves 45p and 45q were formed in symmetrical positions to the central axis 45x of the seed crystal.

Using the seed crystal 45, single crystal 46 was pulled as described below. The seed crystal 45 was caused to descend close to the melt 13 and was preheated. The seed crystal 45 was brought into contact with the surface of the melt 13 and was partially melted into the melt 13. The seed crystal 45 was caused to descend at a speed of 0.2 mm/min so as to dip the front portion 45a of the seed crystal 45 and melt the seed crystal 45 in the range of about 50 mm from the front portion 45a thereof to above the concave 45q into the melt 13. Then, the seed crystal 45 was pulled at a pulling speed of about 0.3 mm/min and by regulating the temperature of a heater 12, a shoulder 46b of the single crystal 46 was formed in the range of 100 mm below from the bottom plane of the seed crystal 45 and was made to grow to have a diameter of about 12 inches. A main body having a diameter of 12 inches was made to grow to have a length of about 1000 mm at a pulling speed of 0.5 mm/min.

The DF rate of the single crystals 46 produced by the method according to Example 4 was 9/10. That is, no dislocation was found in nine out of ten pulled single crystals. The number of falls of the single crystals 46 was 0/10, that is, no falls of the single crystals 46 occurred.

Example 5

In Example 5, except for using a seed crystal 45 having a diameter of 6 mm on which concaves 45p and 45q have a maximum depth of 3.5 mm were formed, the other conditions and the method were the same as those in Example 4.

The DF rate of the single crystals 46 produced by the method according to Example 5 was 9/10. That is, no dislocation was found in nine out of ten pulled single crystals. The number of falls of the single crystals 46 was 0/10, that is, no falls of the single crystals 46 occurred.

Comparative Example 5

In Comparative Example 5, a single crystal 36 was pulled without forming a neck 36a by the method shown in FIG. 2 and on the conditions shown in Table 2. Since the seed crystal 35 was the same as that in Example 4 except for having no concaves 15p and 15q formed thereon, the description is omitted.

The DF rate of the single crystals 36 produced by the method according to Comparative Example 5 was 6/10. That is, no dislocation was found in six out of ten pulled single crystals. The number of falls of the single crystals 36 was 0/10, that is, no falls of the single crystals 36 occurred.

Comparative Example 6

In Comparative Example 6, a single crystal 36 was pulled by the method shown in FIG. 2 and with the conditions shown in Table 2.

A seed crystal 35 having a diameter of 12 mm and a length of 100 mm on which concaves 15p and 15q were not formed was used. In pulling the single crystal 36, a neck 36a having a diameter of about 10 mm was formed.

In order to pull the single crystal 36 using the above seed crystal 35, the seed crystal 35 was caused to descend close to the melt 13 and was preheated. The seed crystal 35 was brought into contact with the surface of the melt 13 and was partially melted into the melt 13. The seed crystal 35 was pulled at a speed of about 4 mm/min with regulating the temperature of a heater 12 so as to form the neck 36a having a diameter of about 10 mm and a length of about 100 mm. Then, the seed crystal 35 was pulled at a pulling speed of 0.3 mm/min and by regulating the temperature of the heater 12, a shoulder 36b of the single crystal 36 was formed in the range of 100 mm below from the lower end of the neck 36a and was made to grow to have a diameter of 12 inches. A main body 36c having a diameter of 12 inches was made to grow to have a length of about 1000 mm at a pulling speed of 0.5 mm/min.

The DF rate of the single crystal 36 produced by the method according to Comparative Example 6 was 0/10. That is, the dislocation was found in all of the pulled single crystals 36. On the other hand, the number of falls of the single crystals 36 was 0/10, that is, no falls of the single crystals 36 occurred.

Comparative Example 7

In Comparative Example 7, a single crystal 36 was pulled by the method shown in FIG. 2 and with the conditions shown in Table 2.

A seed crystal 35 having a diameter of 12 mm and a length of 100 mm on which concaves 15p and 15q were not formed was used. In pulling the single crystal 36, a neck 36a having a diameter of about 6 mm was formed.

In order to pull the single crystal 36 using the above seed crystal 35, in the similar manner to that in Comparative Example 6, the seed crystal 35 was brought into contact with the surface of the melt 13 and was partially melted into the melt 13. The seed crystal 35 was pulled at a speed of about 4 mm/min with regulating the temperature of a heater 12 so as to form the neck 36a having a diameter of about 6 mm and a length of about 100 mm. Then, in the similar manner to that in Comparative Example 6, a shoulder 36b of the single crystal 36 was formed in the range of 100 mm below from the lower end of the neck 36a and was made to grow to have a diameter of 12 inches. A main body 36c having a diameter of 12 inches was made to grow.

The DF rate of the single crystal 36 produced by the method according to Comparative Example 7 was 1/10. That is, the dislocation was found in nine out of ten pulled single crystals. On the other hand, the number of falls of the single crystals 36 was 0/10, that is, no falls of the single crystals 36 occurred.

Comparative Example 8

In Comparative Example 8, a single crystal 36 was pulled by the method shown in FIG. 2 and with the conditions shown in Table 2.

A seed crystal 35 having a diameter of 12 mm and a length of 100 mm on which concaves 15p and 15q were not formed was used. In pulling the single crystal 36, a neck 36a having a diameter of about 4 mm was formed.

In order to pull the single crystal 36 using the above seed crystal 35, in the similar manner to that in Comparative Example 6, the seed crystal 35 was brought into contact with the surface of the melt 13 and was partially melted into the melt 13. The seed crystal 35 was pulled at a speed of about 3 mm/min with regulating the temperature of a heater 12 so as to form the neck 36a having a diameter of about 4 mm and a length of about 100 mm. Then, in the similar manner to that in Comparative Example 6, a shoulder 36b of the single crystal 36 was formed in the range of 100 mm below from the lower end of the neck 36a and was made to grow to have a diameter of 12 inches. A main body 36c having a diameter of 12 inches was made to grow.

The DF rate of the single crystals 36 produced by the method according to Comparative Example 8 was 9/10. That is, no dislocation was found in nine out of ten pulled single crystals. On the other hand, the number of falls of the single crystals 36 was 8/10, that is, the falls of the single crystals 36 occurred in a high probability.

As obvious from the above results, using the seed crystal 45 according to Example 4, since the concaves 45p and 45q having a maximum depth larger than the radius of the seed crystal (l/2) were formed on the side portion of the single crystal 45, the dislocation which was induced in contact with the melt propagated toward the free surfaces of the concaves 45p and 45q, from the property of the propagation direction. And since the maximum depth of the concaves 45p and 45q was larger than the radius of the seed crystal (l/2), most of the propagating dislocation passed through the free surfaces. Even when some of the dislocation remained without passing through the free surface of the concave 45p, the remaining dislocation passed through the free surface of the concave 45q, since the concave 45q was formed in the symmetrical position to the central axis 45x, that is, in the direction to which the remaining dislocation propagated.

In the method for pulling a single crystal 46 according to Example 4, by melting the front portion 45a till above the concave 45q into the melt 13 at a moderate speed, the dislocation portion could be certainly excluded, so that the single crystal 46 could be pulled using the dislocation-free seed crystal 45 as a base. As a result, since no dislocation was induced, the necking step could be omitted. Since the necking step was not necessary, it became unnecessary to hold the seed crystal 46 by a small neck 36a (FIG. 2). Therefore, the diameter l of the seed crystal was the smallest diameter for holding the single crystal 46, so that even a heavy single crystal 46 could be pulled safely without caring about troubles such as falling.

Using the seed crystal 45 according to Example 5, since the seed crystal 45 has a diameter l of 6 mm, it has a sufficient strength even for pulling a heavy single crystal 46 having a weight of 300 kg or so. Therefore, the single crystal 46 could be pulled safely without caring about troubles such as falling of the single crystal 46 caused by breakage of the seed crystal 45. Since the diameter of the seed crystal 45, which is conventionally 12 mm, was narrowed to 6 mm or so, the seed crystal 45 became a quarter in volume, leading to the reduction of the material cost required for the seed crystal 45.

On the other hand, using the seed crystal 35 according to Comparative Example 5, since the concaves 45p and 45q were not formed, the yield of the products did not approach that in Example 5.

Using the seed crystal 35 according to Comparative Example 6, the dislocation occurred in all of the pulled single crystals 36. It is considered that the dislocation existing in the seed crystal 35 could not pass through because of the neck 36a having a large diameter of 10 mm.

Using the seed crystal 35 according to Comparative Example 7, since the neck 36a had a diameter of 6 mm, the single crystals 36 could be pulled safely without falling in ten cases out of ten, even when a heavy single crystal 36 having a weight of 300 kg or so was pulled. But such narrowing of the diameter of the neck 36a was not enough to sufficiently exclude the dislocation induced to the seed crystal 35 in the contact with the melt. The dislocation was found in nine out of ten pulled single crystals.

Using the seed crystal 35 according to Comparative Example 8, since the neck 36a was narrowed to 4 mm, no dislocation was found in nine out of ten pulled single crystals so that the DF rate could be improved. However, the neck 36a having a diameter of only 4 mm could not withstand the weight of the pulled single crystal 36 and was broken, leading to the falling of the single crystal 36 in eight cases out of ten.

Common conditions to Examples 6–10 and Comparative Examples 9–12

The common conditions are the same as the conditions shown in Table 2.

Example 6

In Example 6, a single crystal 56 was pulled by the method shown in FIG. 7 and with the conditions shown in Table 2 as described above. The oxygen content of a seed crystal 55 was $13 \times 10^{17}/cm^3$.

The seed crystal 55 having a diameter of about 10 mm was caused to descend close to a melt 13 and was preheated. The seed crystal 55 was brought into contact with the surface of the melt 13 and partially melted into the melt 13. The seed crystal 55 was caused to descend at a speed of 0.2 mm/min so as to dip the front portion 55a of the seed crystal 55 into the melt 13 and melt the seed crystal 55 in the range of about 20 mm from the front portion 55a thereof. Then, the seed crystal 55 was pulled at a pulling speed of about 0.3 mm/min and by regulating the temperature of a heater 12, a shoulder 56b of the single crystal 56 was formed in the range of 100 mm below from the bottom plane of the seed crystal 55 and was made to grow to have a diameter of 12 inches. A main body having a diameter of 12 inches was made to grow to have a length of about 1000 mm at a pulling speed of about 0.5 mm/min.

The DF rate of the single crystals 56 produced by the method according to Example 6 was 7/10. That is, no dislocation was found in seven out of ten pulled single crystals. The number of falls of the single crystals 56 was 0/10, that is, no falls of the single crystals 56 occurred.

Example 7

In Example 7, except for using a seed crystal 55 having an oxygen content of $16\times10^{17}/cm^3$, the other conditions and the method were the same as those in Example 6.

The DF rate of the single crystals 56 produced by the method according to Example 7 was 8/10. That is, no dislocation was found in eight out of ten pulled single crystals. The number of falls of the single crystals 56 was 0/10, that is, no falls of the single crystals 56 occurred.

Example 8

In Example 8, except for using a seed crystal 55 having an oxygen content of $18\times10^{17}/cm^3$, the other conditions and the method were the same as those in Example 6.

The DF rate of the single crystals 56 produced by the method according to Example 8 was 9/10. That is, no dislocation was found in nine out of ten pulled single crystals. The number of falls of the single crystals 56 was 0/10, that is, no falls of the single crystals 56 occurred.

Example 9

In Example 9, except for using a seed crystal 55 having a diameter of about 6 mm, the other conditions and the method were the same as those in Example 6. The oxygen content of the seed crystal 55 was $13\times10^{17}/cm^3$, the same as that in Example 6.

The DF rate of the single crystals 56 produced by the method according to Example 9 was 7/10. That is, no dislocation was found in seven out of ten pulled single crystals. The number of falls of the single crystals 56 was 0/10, that is, no falls of the single crystals 56 occurred.

Example 10

In Example 10, except for using a seed crystal 55 having a diameter of about 6 mm, the other conditions and the method were the same as those in Example 6. The oxygen content of the seed crystal 55 was $16\times10^{17}/cm^3$, the same as that in Example 7.

The DF rate of the single crystals 56 produced by the method according to Example 10 was 8/10. That is, no dislocation was found in eight out of ten pulled single crystals. The number of falls of the single crystals 56 was 0/10, that is, no falls of the single crystals 56 occurred.

Comparative Example 9

In Comparative Example 9, a single crystal 36 was pulled by the method shown in FIG. 7 and on the conditions shown in Table 2. Since the method for pulling a single crystal 36 was the same as that in Example 6 except for the oxygen content of the seed crystal 35, the description is omitted. The oxygen content of the seed crystal 35 was $11\times10^{17}/cm^3$.

The DF rate of the single crystals 36 produced by the method according to Comparative Example 9 was 6/10. That is, no dislocation was found in six out of ten pulled single crystals. The number of falls of the single crystals 36 was 0/10, that is, no falls of the single crystals 36 occurred.

Comparative Example 10

In Comparative Example 10, a single crystal 36 was pulled after forming a neck 36a having a diameter of 10 mm by the method shown in FIG. 2 and on the conditions shown in Table 2. The oxygen content of the seed crystal 35 was $16\times10^{17}/cm^3$, the same as that in Example 7. The oxygen content of the pulled single crystal 36 was $11\times10^{17}/cm^3$, the same as a conventional one.

The seed crystal 35 having a diameter of 12 mm was caused to descend close to a melt 13 and was preheated. The seed crystal 35 was brought into contact with the surface of the melt 13 and was partially melted into the melt 13. The seed crystal 35 was pulled at a speed of about 4 mm/min with regulating the temperature of a heater 12 so as to form a neck 36a having a diameter of about 10 mm and a length of about 100 mm. Then, the seed crystal 35 was pulled at a pulling speed of 0.3 mm/min and by regulating the temperature of the heater 12, a shoulder 36b was formed in the range of 100 mm below from the lower end of the neck 36a and was made to grow to have a diameter of 12 inches. A main body 36c having a diameter of 12 inches was made to grow to have a length of about 1000 mm at a pulling speed of 0.5 mm/min.

The DF rate of the single crystals 36 produced by the method according to Comparative Example 10 was 0/10. That is, the dislocation was found in all of the pulled single crystals 36. On the other hand, the number of falls of the single crystals 36 was 0/10, that is, no falls of the single crystals 36 occurred.

Comparative Example 11

In Comparative Example 11, a single crystal 36 was pulled after forming a neck 36a having a diameter of 6 mm. The other conditions and method were the same as those in Comparative Example 10.

The DF rate of the single crystals 36 produced by the method according to Comparative Example 11 was 1/10. That is, the dislocation was found in nine out of ten pulled single crystals. On the other hand, the number of falls of the single crystals 36 was 0/10, that is, no falls of the single crystals 36 occurred.

Comparative Example 12

In Comparative Example 12, a single crystal 36 was pulled after forming a neck 36a having a diameter of about 4 mm. The other conditions and method were the same as those in Comparative Example 10.

The DF rate of the single crystals 36 produced by the method according to Comparative Example 12 was 9/10. That is, no dislocation was found in nine out of ten pulled single crystals. The number of falls of the single crystals 36 was 8/10, that is, eight out of ten pulled single crystals 36 fell in the middle of the pulling.

As obvious from the above results, since the seed crystals 55 according to Examples 6–8 have an oxygen content of $13\times10^{17}/cm^3$, $16\times10^{17}/cm^3$, or $18\times10^{17}/cm^3$, respectively, each of which is higher than the general one ($11\times10^{17}/cm^3$), the stress level necessary for the dislocation induced in contact with the melt to propagate upward in the seed crystal 55 could be made higher than usual. That is, the dislocation did not propagate, as long as a stress of much higher level than usual did not work. Therefore, by melting the portion where the dislocation was induced in contact with the melt (the front portion 55a) into the melt at a moderate speed, the portion where the dislocation was induced (the front portion 55a) could be excluded without propagating the dislocation, so that the single crystal could be pulled using the dislocation-free seed crystal as a base. As a result, the Dislocation Free rate of the pulled single crystals 55 could be made higher.

In the methods for pulling a single crystal 56 according to Examples 6–8, since the necking step was not necessary, it became unnecessary to hold the single crystal 56 by a small neck 36a (FIG. 2). Accordingly, the diameter of the seed crystal (10 mm) was the smallest diameter for holding the single crystal 56, so that even a heavy single crystal 56 (300 kg) could be pulled safely without caring about troubles such as falling.

Since the seed crystals 55 according to Examples 9 and 10 had an oxygen content of $13 \times 10^{17}/cm^3$ or $16 \times 10^{17}/cm^3$, respectively, and had a diameter 1 of 6 mm, they had a sufficient strength even when a heavy single crystal 56 having a weight of 300 kg or so was pulled. The single crystal 56 could be pulled safely with few cares about troubles such as falling of the single crystal 56 caused by breakage of the seed crystal 55. Since the diameter of the seed crystal 55 which is conventionally 12 mm or so was narrowed to 6 mm or so, it became a quarter in volume, leading to the reduction of the material cost required for the seed crystal 55.

In the methods for pulling a single crystal 56 according to Examples 6–10, since the length L of the seed crystal 55 melted into the melt was 20 mm, more than 6 mm, most of the portion where the dislocation was induced could be melted, so that the residual of the seed crystal 55 could be allowed to include only a dislocation-free portion. By pulling the seed crystal 56 using the seed crystal 55 including only the dislocation-free portion, the yield of the single crystals 56 could be improved.

On the other hand, using the seed crystal 35 according to Comparative Example 9, since the oxygen content was $11 \times 10^{17}/cm^3$, the same as a conventional one, the yield of the products could not approach those in Examples 6–8.

In the method for pulling a single crystal 36 according to Comparative Example 10, though the oxygen content was the same as that in Example 7 ($16 \times 10^{17}/cm^3$), the dislocation occurred in all of the pulled single crystals 36. The reason is considered as follows. Although the seed crystal 35 had a high oxygen content ($16 \times 10^{17}/cm^3$), there was not a step of melting the front portion 35a where the dislocation was induced and a neck 36a having a usual oxygen content ($11 \times 10^{17}/cm^3$) was formed directly on the front portion 35a, so that the dislocation could not be prevented from propagating to the neck 36a, even if the dislocation could be prevented from propagating to the seed crystal 35. Since the diameter of the neck 36a was 10 mm, large, the narrowing of the neck to that extent could not make the propagating dislocation pass through. On the other hand, since the diameter of the neck 36a was 10 mm, large, the single crystals 36 could be pulled safely without falls thereof.

In the method for pulling a single crystal 36 according to Comparative Example 11, since the diameter of the neck 36a was narrowed to 6 mm, the DF rate was slightly higher than that in Comparative Example 10. But the dislocation still occurred in the single crystals 36 in a high probability, resulting in the low yield of the products. The reason is considered that such narrowing of the neck 36a that the diameter of the neck 36a was narrowed to 6 mm could not make the propagating dislocation pass through. On the other hand, since the diameter of the neck 36a was 6 mm or so, the single crystals 36 could be pulled safely without falls thereof.

In the method for pulling a single crystal 36 according to Comparative Example 12, since the diameter of the neck 36a was narrowed to 4 mm or so, the propagating dislocation could be made to pass through, resulting in the sharp improvement in the DF rate. But since the neck 36a did not have a sufficient strength because of the diameter of 4 mm or so, the falls of the single crystals 36 occurred in a high probability.

Common conditions to Examples 11 and 12, and Comparative Examples 13 and 14

Common conditions to Examples 11 and 12, and Comparative Examples 13 and 14 are the same as the conditions shown in Table 2. The impurity content of the seed crystal was $1 \times 10^{15}/cm^3$ of phosphorus.

Example 11

In Example 11, a single crystal 66 was pulled by the method shown in FIG. 9 and on the conditions shown in Table 2 as described above.

A seed crystal 65 having a diameter of about 10 mm was caused to descend close to a melt 13 and was preheated. The seed crystal 65 was brought into contact with the surface of the melt 13. The seed crystal 65 was caused to descend at a speed of 0.5 mm/min so as to melt the seed crystal 65 in the range of about 20 mm from the lower end thereof. Then, the seed crystal 65 was pulled at a pulling speed of about 0.3 mm/min and by regulating the temperature of a heater 12, a shoulder 66b of the single crystal 66 was formed in the range of 100 mm below from the front plane 65a of the seed crystal 65 and was made to grow to have a diameter of 12 inches. A main body having a diameter of 12 inches was made to grow to have a length of about 1000 mm at a pulling speed of about 0.5 mm/min.

The DF rate of the single crystals 66 produced by the method according to Example 11 was 7/10. That is, no dislocation was found in seven out of ten pulled single crystals. The number of falls of the single crystals 66 was 0/10, that is, no falls of the single crystals 66 occurred.

Example 12

In Example 12, except for using a seed crystal 65 having a diameter of 6 mm, the pulling was carried out on the same conditions and by the same method as those in Example 11.

The DF rate of the single crystals 66 produced by the method according to Example 12 was 8/10. That is, no dislocation was found in eight out of ten pulled single crystals. The number of falls of the single crystals 66 was 0/10, that is, no falls of the single crystals 66 occurred.

Comparative Example 13

In Comparative Example 13, a single crystal 36 was pulled on the conditions shown in Table 2 as described above.

A seed crystal 35 having a diameter of about 10 mm was caused to descend close to a melt 13 and was preheated. The seed crystal 35 was brought into contact with the surface of the melt 13. Then, the seed crystal 35 was pulled at a pulling speed of about 3 mm/min with regulating the temperature of a heater 12 so as to form a neck 36a having a diameter of about 4 mm and a length of about 100 mm. The seed crystal 35 was pulled at a pulling speed of about 0.3 mm/min and by regulating the temperature of the heater 12, a shoulder 36b of the single crystal 36 was formed in the range of 100 mm below from the lower end of the neck 35a of the seed crystal 35 and was made to grow to have a diameter of 12 inches. A main body having a diameter of 12 inches was made to grow to have a length of about 1000 mm at a pulling speed of about 0.5 mm/min.

The DF rate of the single crystals 66 produced by the method according to Comparative Example 13 was 9/10. That is, no dislocation was found in nine out of ten pulled single crystals. The number of falls of the single crystals 36 was 8/10, that is, 80% of the single crystals 36 fell in the middle of the pulling.

Comparative Example 14

In Comparative Example 14, using a seed crystal 35 having a diameter of 18 mm, a single crystal 36 was pulled on the same conditions and by the same method as those in Comparative Example 13, except for regulating the temperature of a heater 12 so as to make the diameter of a neck 36a 10 mm.

The DF rate of the single crystals 36 produced by the method according to Comparative Example 14 was 0/10. That is, the dislocation was found in all of the pulled crystals 36. On the other hand, the number of falls of the single crystals 36 was 0/10, that is, no falls of the single crystals 36 occurred.

As described above, in the method for pulling a single crystal according to Example 11, since the front portion 65A of the seed crystal 65 having the dislocation which occurred in contact with the melt was melted, the single crystal 66 could be pulled using the seed crystal 65 including only a dislocation-free portion as a base. Therefore, the dislocation did not propagate to the pulled single crystal 66, so that the dislocation could be efficiently excluded even if the necking step was omitted. Since the necking step was not necessary, it became unnecessary to hold the single crystal 66 by a small neck 36a (FIG. 2). Accordingly, the diameter of the seed crystal 65 (10 mm) was the smallest diameter for holding the single crystal 66, so that even a heavy single crystal 65 (300 kg) having a large diameter (12 inches) could be pulled safely without caring about troubles such as falling. Since the melting speed of the seed crystal 65 was 0.5 mm/min, the initial dislocation portion induced in contact with the melt could be melted before the dislocation newly propagated by the melting. Since the length of the seed crystal 65 melted into the melt was 20 mm, longer the diameter thereof (10 mm), the whole of the initial dislocation portion and the portion to which the initial dislocation propagated could be melted, so that the seed crystal 65 could be allowed to include only a dislocation-free portion.

In Example 12, since the diameter of the seed crystal 45 which was conventionally 12 mm or so was narrowed to 6 mm or so, the seed crystal 45 became a quarter in volume, but the same effects as those in Example 11 were obtained. As a result, the material cost required for the seed crystal 65 could be reduced as well as the above effects could be obtained.

On the other hand, in the method according to Comparative Example 13, though the dislocation could be excluded, the necking step was needed. Since the neck 36a having a diameter of 4 mm was formed by narrowing the diameter of the seed crystal 35 of 10 mm, so as to make the diameter of the neck 36a (4 mm) the smallest diameter for holding the single crystal 36, such a small neck 36a having a diameter of 4 mm easily caused the falls of the single crystals 36 and the single crystals 36 could not be made to grow safely.

In the method according to Comparative Example 14, since the neck 36a having a diameter of 10 mm was formed by narrowing the diameter of the seed crystal 35 of 18 mm, so as to make the diameter of the neck 36a (10 mm) the smallest diameter for holding the single crystal 36, no falls of the single crystals 36 occurred, but the necking step was needed. When the diameter of the neck 36a was 10 mm, the dislocation could not be efficiently excluded and the dislocation occurred in all of the pulled single crystals 36.

What is claimed is:

1. A method for pulling a single crystal using a seed crystal having a cylindrical body and a conical front portion, comprising pulling a single crystal without melting the conical front portion of the seed crystal before dipping the front portion of the seed crystal into a melt, and without forming a neck after dipping and melting the front portion of the seed crystal into a melt.

2. A method for pulling a single crystal according to claim 1, wherein the seed crystal has a cylindrical body whose diameter is 6 mm or more.

3. A method for pulling a single crystal according to claim 1, wherein the front portion of the seed crystal for pulling a single crystal has a diameter of 6 mm or more after being melted.

4. A seed crystal for pulling a single crystal, having phosphorus (P) as a dopant, ranging in dopant concentration from $1 \times 10^{19}$ to $1 \times 10^{21}/cm^3$.

5. A seed crystal for pulling a single crystal, having boron (B) as a dopant, ranging in dopant concentration from $5 \times 10^{19}$ to $6 \times 10^{20}/cm^3$.

6. A method for pulling a single crystal, wherein using the seed crystal for pulling a single crystal defined in claim 4 or 5, a single crystal is pulled without forming a neck after dipping and melting the front portion of the seed crystal into a melt.

7. A method for pulling a single crystal according to claim 6, wherein the melting length of the seed crystal is the same as the diameter of the single crystal or longer.

8. A seed crystal for pulling a single crystal, having a concave including a curve or wedge in sectional form whose maximum depth is larger than the radius of the seed crystal, which is formed on the side portion of the seed crystal.

9. A seed crystal for pulling a single crystal, defined in claim 8, having two or more concaves formed in the symmetrical positions to the central axis of the seed crystal.

10. A method for pulling a single crystal, wherein using the seed crystal for pulling a single crystal defined in claim 8 or 9, a single crystal is pulled without forming a neck after dipping and melting the front portion of the seed crystal till above concaves into a melt.

11. A seed crystal for pulling a single crystal, defined in claims 8 or 9, having a diameter of 6 mm or more.

12. A method for pulling a single crystal, wherein using the seed crystal for pulling a single crystal defined in claim 11, a single crystal is pulled without forming a neck after dipping a melting the front portion of the seed crystal into a melt.

13. A seed crystal for pulling a single crystal, defined in claim 12, of which a length of 6 mm or more is melted into the melt.

14. A seed crystal for pulling a single crystal, having an oxygen content ranging from $13 \times 10^{17}$ to $18 \times 10^{17}/cm^3$.

15. A seed crystal for pulling a single crystal, defined in claims 4, 5 or 14, having a diameter of 6 mm or more.

16. A method for pulling a single crystal, wherein using the seed crystal for pulling a single crystal defined in claim 15, a single crystal is pulled without forming a neck after dipping and melting the front portion of the seed crystal into a melt.

17. A seed crystal for pulling a single crystal, defined in claim 16, of which a length of 6 mm or more is melted into the melt.

18. A method for pulling a single crystal, wherein using the seed crystal for pulling a single crystal defined in claim 14, a single crystal is pulled without forming a neck after dipping and melting the front portion of the seed crystal into a melt.

19. A method for pulling a single crystal, wherein the seed crystal is brought into contact with a melt, the front portion of the seed crystal is melted, and a single crystal is pulled.

20. A method for pulling a single crystal according to claim 19, wherein the melting speed of the seed crystal is 0.05–2 mm/min, and the length of the seed crystal melted into the melt is the same as the diameter of the seed crystal or longer.

* * * * *